(12) United States Patent
Fuentes et al.

(10) Patent No.: US 8,093,691 B1
(45) Date of Patent: Jan. 10, 2012

(54) SYSTEM AND METHOD FOR RF SHIELDING OF A SEMICONDUCTOR PACKAGE

(75) Inventors: Ruben Fuentes, Gilbert, AZ (US); Christopher Scanlan, Hellerup (DK); Jong Chun, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 132 days.

(21) Appl. No.: 12/502,409

(22) Filed: Jul. 14, 2009

(51) Int. Cl.
*H01L 23/552* (2006.01)
*H01L 23/52* (2006.01)
*H01L 293/40* (2006.01)
*H01L 23/48* (2006.01)
*H01L 23/28* (2006.01)

(52) U.S. Cl. ......... 257/660; 257/659; 257/787; 257/734

(58) Field of Classification Search ................. 257/660, 257/690, 692, 734, 735, 748, 779, 780, 784, 257/787, 659, 662, 700, 686, 704, 724, 760, 257/687

See application file for complete search history.

(56) References Cited

U.S. PATENT DOCUMENTS

| | | | |
|---|---|---|---|
| 4,925,024 A | 5/1990 | Ellenberger et al. | |
| 5,166,772 A | 11/1992 | Soldner et al. | |
| 5,416,358 A | 5/1995 | Ochi et al. | |
| 5,468,999 A | 11/1995 | Lin et al. | |
| 5,473,191 A | 12/1995 | Tanaka | |
| 5,557,142 A | 9/1996 | Gilmore et al. | |
| 5,614,694 A | 3/1997 | Gorenz, Jr. et al. | |
| 5,639,989 A | 6/1997 | Higgins, III | |
| 5,656,864 A | 8/1997 | Mitsue et al. | |
| 5,694,300 A | 12/1997 | Mattei et al. | |
| 5,907,271 A | 5/1999 | Hirano et al. | |
| 5,940,271 A | 8/1999 | Mertol | |
| 6,136,131 A | 10/2000 | Sosnowski | |
| 6,194,655 B1 | 2/2001 | Lange, Sr. et al. | |
| 6,246,115 B1 | 6/2001 | Tang et al. | |
| 6,423,570 B1 | 7/2002 | Ma et al. | |
| 6,433,420 B1 | 8/2002 | Yang et al. | |
| 6,465,280 B1 | 10/2002 | Martin et al. | |
| 6,602,737 B2 | 8/2003 | Wu | |
| 6,686,649 B1 | 2/2004 | Mathews et al. | |
| 7,030,469 B2 * | 4/2006 | Mahadevan et al. | 257/659 |
| 2002/0089832 A1 | 7/2002 | Huang | |
| 2003/0067757 A1 | 4/2003 | Richardson et al. | |
| 2005/0280139 A1 | 12/2005 | Zhao et al. | |
| 2007/0030661 A1 | 2/2007 | Morris et al. | |
| 2007/0176281 A1 * | 8/2007 | Kim et al. | 257/700 |

* cited by examiner

*Primary Examiner* — Chuong A. Luu

(74) *Attorney, Agent, or Firm* — Jeffrey D. Moy; Weiss & Moy, P.C.

(57) ABSTRACT

A semiconductor device has a substrate having a plurality of metal traces. At least one electronic component is electrically coupled to a first surface of the substrate. A mold compound is used for encapsulating portions of the electronic component and the first surface of the substrate, wherein a portion of the mold compound is removed around at least one side of the electronic component. A conductive coating is applied to the mold compound and an area where the portion of the mold compound is removed.

18 Claims, 28 Drawing Sheets

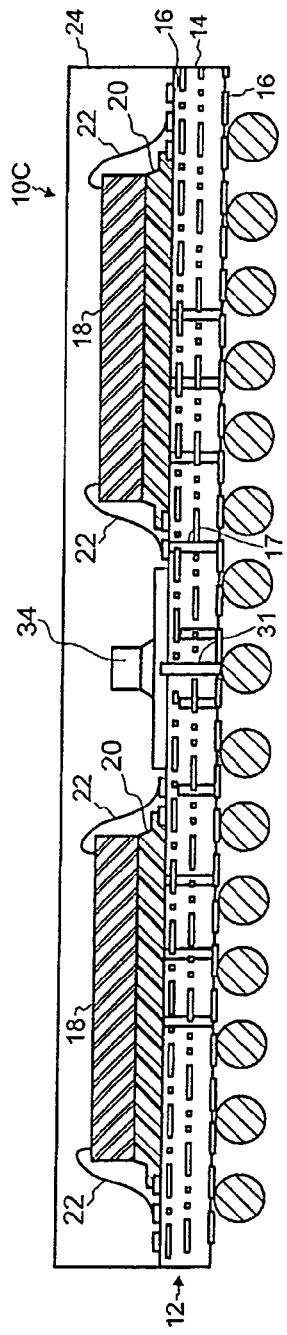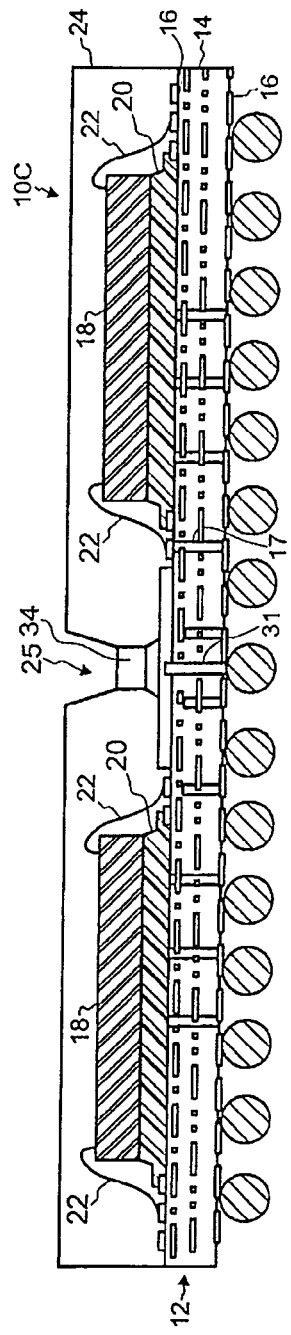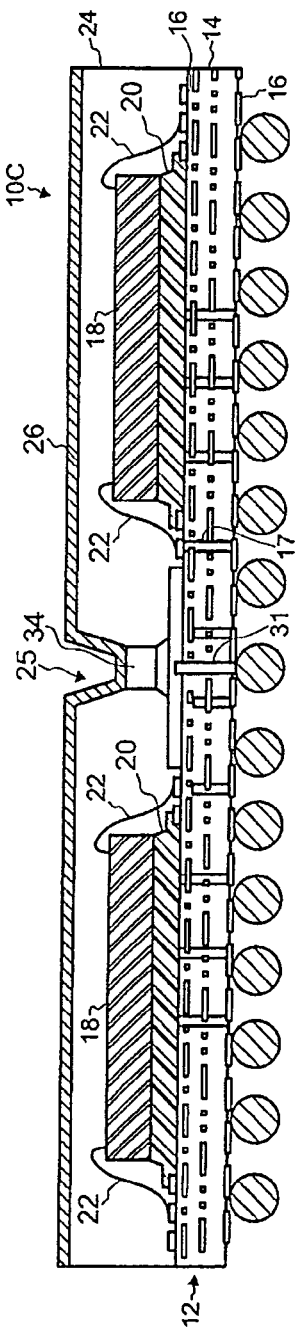

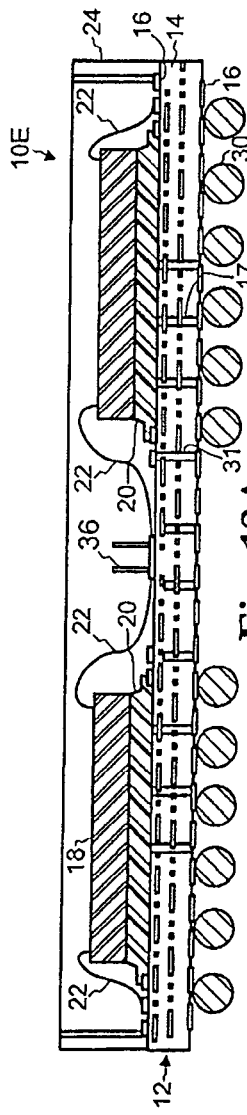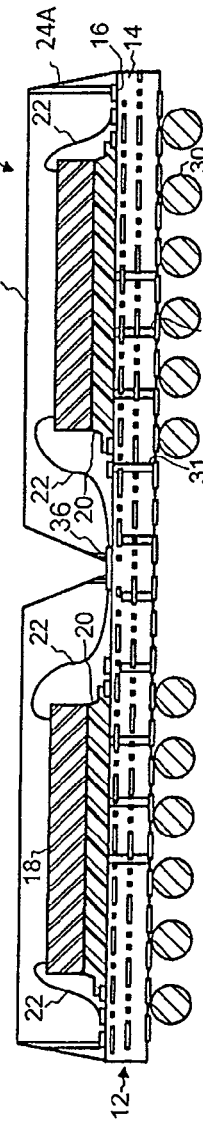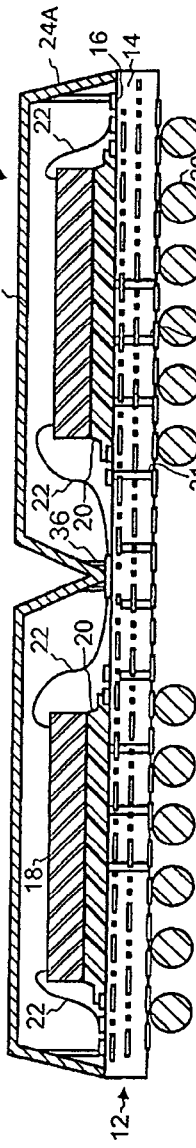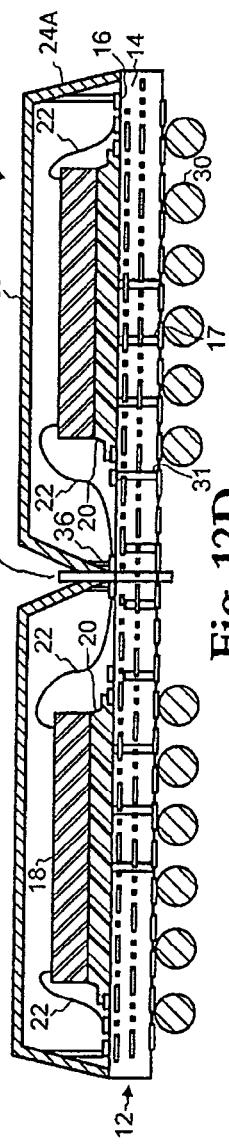

SYSTEM AND METHOD FOR RF SHIELDING OF A SEMICONDUCTOR PACKAGE

FIELD OF THE INVENTION

This invention relates to Radio Frequency (RF) shielding and, more specifically, to a system and method for providing full package and compartmental shielding in a semiconductor package that provides a more effective shielding method than conformal shielding alone.

BACKGROUND OF THE INVENTION

Radio Frequency (RF) shielding may be required on certain semiconductor devices and modules (hereinafter semiconductor device) in order to minimize Electro-Magnetic Interference (EMI) radiation from the semiconductor device. RF shielding is further required to prevent RF radiation from external sources from interfering with operation of the semiconductor device. In a semiconductor device which integrates multiple functions/modules (front end module+transmitter, radio+baseband, etc.) compartmental shielding may be required to minimize EMI radiation from the different components/modules and to prevent RF radiation from interfering with operation of the different components/modules in the semiconductor device.

There are several different methods used for compartmental shielding of semiconductor devices which integrates multiple functions/modules. Known methods of compartmental shielding include embedded shields, metal cans with compartmental features, wire fences, and laser ablated vias. Presently, there are issues with shield effectiveness in mold cavities. Existing solutions such as wire fence and via ablation have reduced performance as the mold cap gets thicker because the gap between ground structures increases. Even multi-tier wire fence cannot resolve this issue completely. Thus, it is beneficial to reduce the maximum gap between ground structures in order to increase shield effectiveness.

Furthermore, in Through Mold Via Package on Package (TMV PoP) shielding, a two tier mold cap may be used. In this type of packaging, a wire fence may be required to shield the perimeter of the module because it may be difficult to perform laser ablation of the TMV vias after singulating the units as is required for a full saw shield structure. Wire fence may be difficult to implement on a two tier structure. Thus, it would be beneficial to have a consistent wire loop height around the module where one could saw in order to cut through the thick portion of the mold cap to expose the wires.

Therefore, a need existed to provide a system and method to overcome the above problems. The system and method would provide for a more effective RF shield for a semiconductor device.

SUMMARY OF THE INVENTION

A semiconductor device has a substrate having a plurality of metal traces. At least one electronic component is electrically coupled to a first surface of the substrate. A mold compound is used for encapsulating portions of the electronic component and the first surface of the substrate, wherein a portion of the mold compound is removed around at least one side of the electronic component. A conductive coating is applied to the mold compound and an area where the portion of the mold compound is removed A method of manufacturing a semiconductor package comprising: electrically attaching a plurality of electronic components to a first surface of a first substrate, the first substrate having a plurality of metal traces; applying a mold compound to encapsulate portions of the plurality of electronic components and portions of the first surface of the first substrate; removing a portion of the mold compound between the plurality of electronic components; and applying a conductive coating to the mold compound and to an area where the mold compound was removed.

The present invention is best understood by reference to the following detailed description when read in conjunction with the accompanying drawings.

BRIEF DESCRIPTION OF THE DRAWINGS

FIGS. 10A-10C shows a process of forming the semiconductor device of FIG. 9.

FIGS. 12A-12D shows a process of forming the semiconductor device of FIG. 11.

Common reference numerals are used throughout the drawings and detailed description to indicate like elements.

DETAILED DESCRIPTION

Figure 1A:
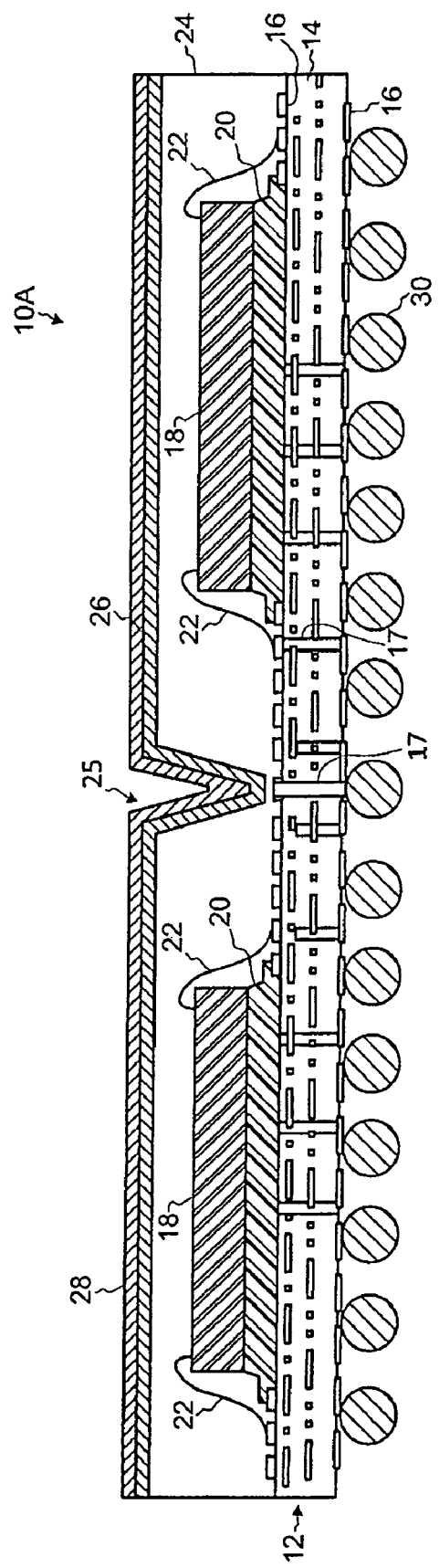
FIG. 1A is a cross-sectional side view of one embodiment of the semiconductor device of the present invention.

Referring to FIG. 1A, a semiconductor device 10A (hereinafter device 10A) is shown. The device 10A has a substrate 12. The substrate 12 may be any one chosen from a conventional rigid PCB, a flexible PCB, and an equivalent thereof, but the kind of substrate 12 is not limited herein. The substrate 12 may include an insulation layer 14 having predetermined area and thickness. The insulation layer 14 may have an approximately planar first surface and an approximately planar second surface opposing the first surface. The substrate 12 may have a plurality of metal traces 16 formed on the first surface of the insulation layer 14. A plurality of metal traces 16 may also be formed on the second surface of the insulation layer 14. The number of metal traces 16 is not limited to the number shown in the FIG. 1A. If multiple layers of metal traces 16 are formed, a dielectric layer may be applied between the metal traces 16. The dielectric layer may be used as an insulating layer to separate two signal layers. The number of multiple layers of metal traces 16 and insulation layers 14 is not limited to that shown in FIG. 1A. A soldermask may be placed over the top surface of the metal traces 16 formed on the substrate 12. The soldermask may be used to protect the metal traces 16. One or more vias 17 may be formed through the insulation layer 14. The vias 17 may be used as an interconnect to connect different layers of metal traces 16.

One or more electronic component 18 may be attached to a first surface of the first substrate 12. The electronic component 18 may be prepackaged semiconductor device, bare semiconductor die, or a passive component. It should be noted that the listing of the above types of electronic components 18 is given as an example and should not be seen as to limit the scope of the present invention. In the embodiment shown in FIG. 1A, two electronic components 18 are attached to a first surface of the first substrate 12.

The electronic components 18 may be coupled to the first surface of the first substrate 12 in a plurality of different manners. In the embodiment shown in FIG. 1A, an adhesive 20 may be used to couple the electronic components 18 to the first substrate 12. The adhesive 20 may be an adhesive film, an epoxy, or the like. The listing of the above adhesive types should not be seen as to limit the scope of the present invention. The electronic components 18 may then be electrically coupled to the first substrate 12 through the use of wirebonds 22. Alternatively, the electronic components 18 may be coupled to the substrate 12 through flip chip bonding, surface mount technology (SMT) or the like. The listing of the above coupling types should not be seen as to limit the scope of the present invention.

A mold compound 24 may be used to encapsulate the device 10A. The mold compound 24 may be made of a thermosetting plastic material like epoxy. The listing of the above types of mold compounds 24 should not be seen as to limit the scope of the present invention. The mold compound 24 may be used to encapsulate the components of the device 10A (i.e., electronic components 18), the wirebonds 22, and exposed areas of the first surface of the substrate 12.

Portions 25 of the mold compound 24 may be removed between the electronic components 18. The mold compound 24 may be removed between the electronic components 18 to compartmentalize and provide EMI and RF shielding between the electronic components 18. The mold compound 24 may be compartmentalized any number of times to isolate any number of electronic components 18. The mold compound 24 may be removed via a mechanical process such as sawing, via laser, or the like. The above listing is given as an example and should not be seen as to limit the scope of the present invention. In the embodiment shown in FIG. 1A, the mold compound 24 is removed between the electronic components 18 so that a small portion of mold compound 24 remains above the first surface of the substrate 12.

A conductive coating 26 may then be applied to the device 10A. The conductive coating 26 may be used to provide EMI shielding for the device 10A. The conductive coating 26 may be applied by plating, vacuum printing, vacuum deposition, insert molding, spray coating, and the like. The above listing is given as an example and should not be seen as to limit the scope of the present invention. The conductive coating 26 may be applied to the top surface of the mold compound 24. In FIG. 1A, the conductive coating 26 is a conformal coating. In a conformal coating, a thin layer of the conductive coating 26 is applied to the top surface of the device 10A.

By removing portions of the mold compound 24 between the electronic components 18 and then applying the conductive coating 26, a compartmentalized EMI shield is formed between the electronic components 18. The smaller the gap between the electronic components 18, the more effective the EMI shield.

In accordance with one embodiment, the conductive coating 26 may also be applied to side surfaces of the mold compound 24 and to side surfaces of the substrate 12. The conductive coating 26 may be attached to metal traces 16 which are exposed on side surfaces of the substrate 12. The exposed metal traces 16 will be ground planes. Thus, the semiconductor device 10A will have a conductive material 26 that contacts grounded metal. The above is given as an example regarding how the conductive coating 26 may be attached to the metal traces 16 at or near the side surface of the substrate 12 and should not be seen as to limit the scope of the present invention.

A non-conductive coating 28 may be applied to the conductive coating 26. The non-conductive coating 28 may be used as a protective layer to protect the conductive coating 26 and hence the device 10A from solvents, solders, fluxes, etc.

Electrical contacts 30 may be coupled to a second surface of the substrate 16. The electrical contacts 30 may be a plurality of solder balls as shown in FIG. 1A, a plurality of leads, or the like. If solder balls are used, the solder balls may be electrically coupled to the second surface of the substrate 12. In general, a reflow process may be used to couple the solder balls to the second surface of the substrate 12. Alternative methods may be used to couple the leads to the substrate 16 without departing from the spirit and scope of the present invention.

Figure 1B:
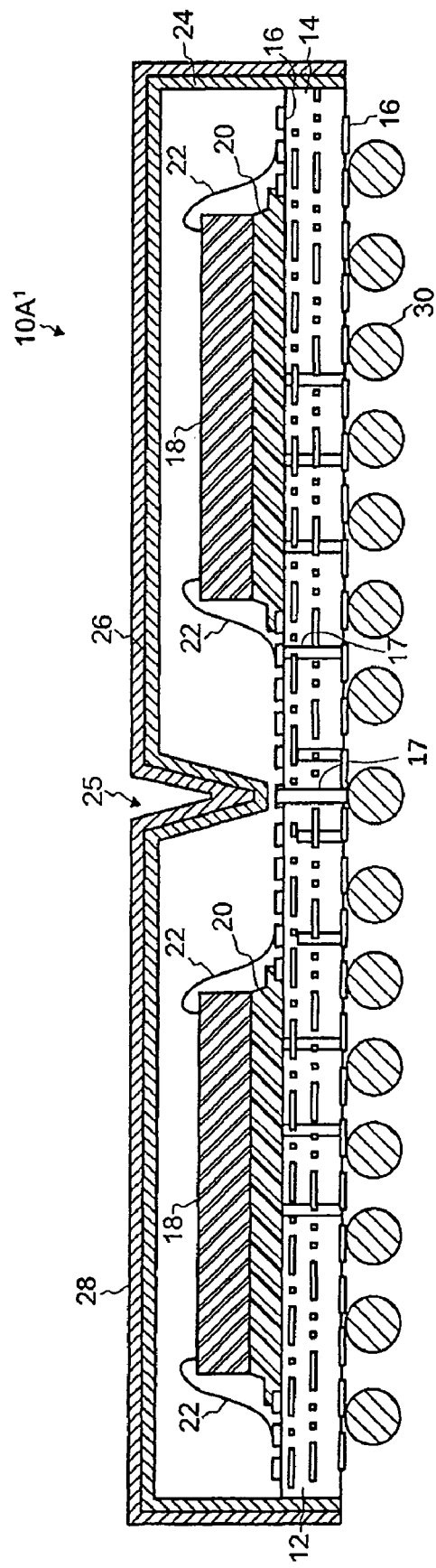
FIG. 1B is a cross-sectional side view of the embodiment of FIG. 1A showing one type of perimeter shield for the semiconductor device of the present invention.

Referring to FIG. 1B, the device 10A may provide compartmental and perimeter RF shielding. In FIG. 1B, the conductive coating 26 may be applied to side surfaces of the mold compound 24 and to side surfaces of the substrate 12. The conductive coating 26 may be attached to metal traces 16 which are exposed on side surfaces of the substrate 12. The exposed metal traces 16 will be ground planes. Thus, the semiconductor device 10A will have a conductive material 26 that contacts grounded metal to provide a perimeter RF shield.

Figure 1C:
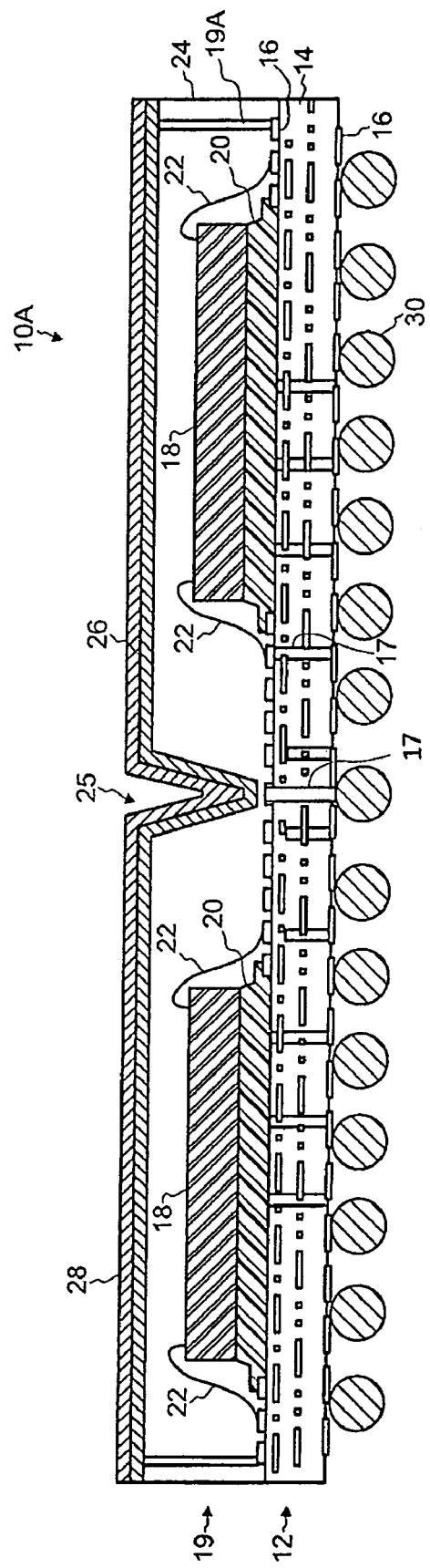
FIG. 1C is a cross-sectional side view of the embodiment of FIG. 1A showing another type of perimeter shield for the semiconductor device of the present invention.

Alternatively, as shown in FIG. 1C, the device 10A provides perimeter shielding by attaching a plurality of conductive devices 19 around a perimeter of the device 10A. In the present embodiment, the conductive devices 19 are wires 19A. However, other conductive devices 19 may be used without departing from the spirit and scope of the present invention. The wires 19A may have at least one end attached to a metal trace 16. Alternatively, both ends of the wire 19A may be attached to a metal trace 16. The metal trace 16 will generally be grounded. A section of the wire 19A will be exposed through the mold compound 24. The exposed portion of the wire 19A may contact the conductive coating 26. Thus, the semiconductor device 10A will have a conductive material 26 that contacts grounded metal to provide a perimeter RF shield.

Figure 1D:
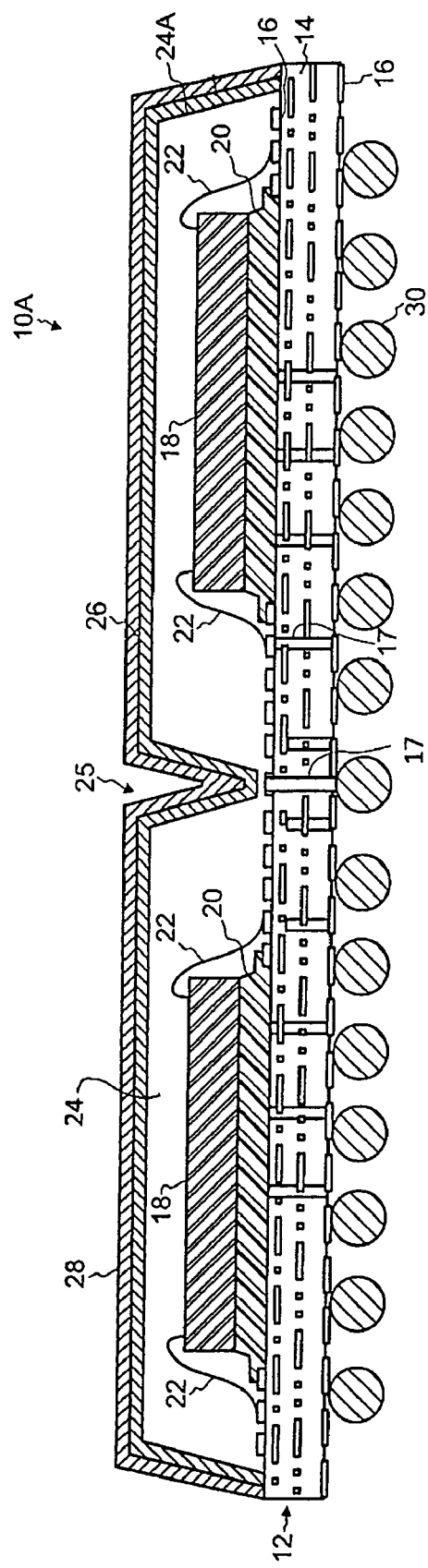
FIG. 1D is a cross-sectional side view of the embodiment of FIG. 1A showing another type of perimeter shield for the semiconductor device of the present invention.

Alternatively, as shown in FIG. 1D, the device 10A provides perimeter shielding by removing portions of the mold compound 24 to form side surfaces 24A. The mold compound 24 may be removed by a saw cut, laser ablation, or the like. The listing of the above is given as an example and should not be seen in a limiting scope. The conductive coating 26 may be applied to the top and side surfaces 24A of the mold compound 24 to form a perimeter RF shield.

Figure 1E:
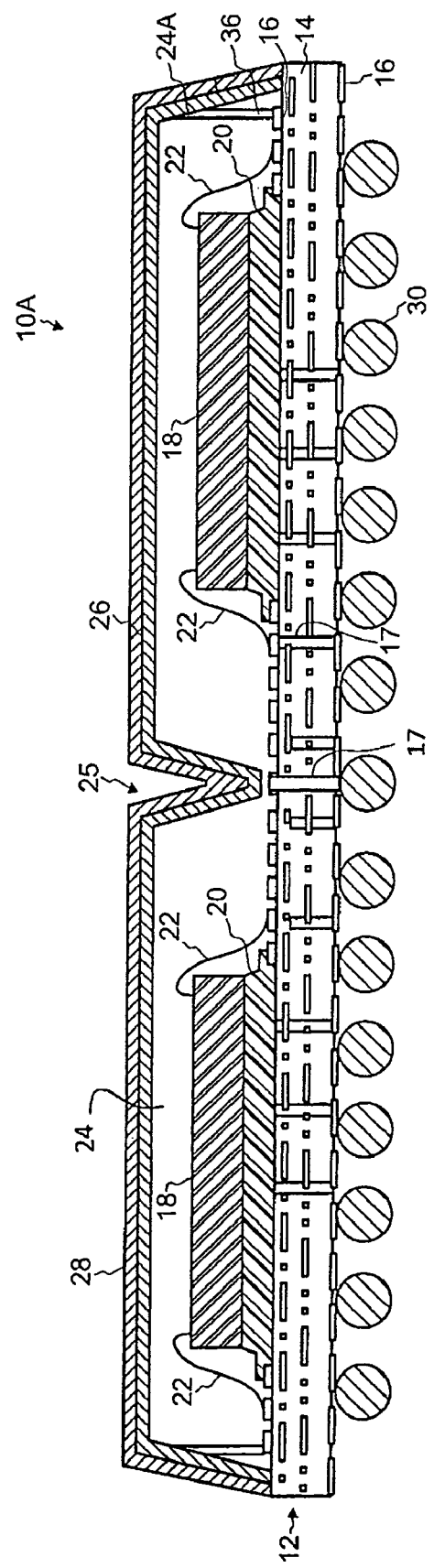
FIG. 1E is a cross-sectional side view of the embodiment of FIG. 1A showing another type of perimeter shield for the semiconductor device of the present invention.

Alternatively, as shown in FIG. 1E, ground wires 36 may be attached to metal traces 16. In the embodiment shown in FIG. 1E, the ground wires 36 are attached to metal traces 16 which are grounded. The ground wires 36 may be positioned around a perimeter of the device 10A. In the embodiment shown in FIG. 1E, the ground wires 36 may have a height which is less than a height of the electronic component 18. After the mold compound 24 encapsulates the device 10A, portions of the mold compound 24 may be removed so that a section of the ground wires 36 are exposed. In accordance with one embodiment, the mold compound 24 is removed to form angled side surfaces 24A on the mold compound 24. The top sections of the ground wires 36 are exposed on the angled surfaces 24A. It should be noted that the side surface 24A may or may not be angled and is given as an example and should not be seen as to limit the spirit and scope of the present invention. The conductive coating 26 may then be applied to the device 10A. The conductive coating 26 may be applied to the top surface of the mold compound 24 and to the sections of the ground wires 36 which are exposed. Thus, the semiconductor device 10A will have a conductive material 28 that contacts grounded metal.

FIGS. 1B-1E show different alternatives for providing perimeter shielding for the device 10A. The above is given as examples. Other methods of providing perimeter shielding for the device 10A may be sued without departing from the spirit and scope of the present invention.

Figure 2A:
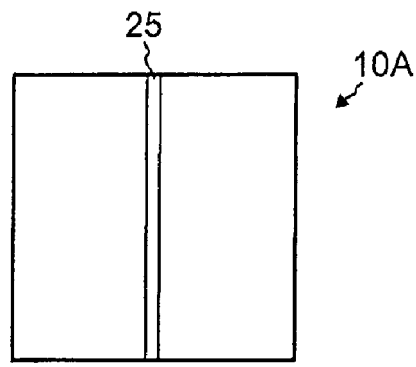
FIG. 2A shows a top view of one embodiment of the semiconductor device of FIG. 1.
Figure 2B:
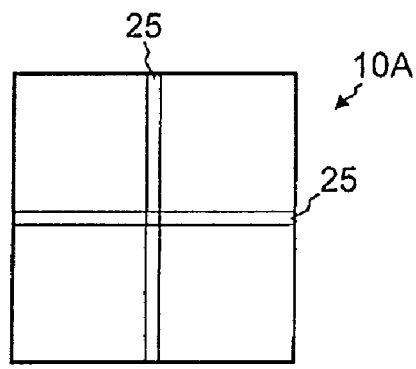
FIG. 2B shows a top view of another embodiment of the semiconductor device of FIG. 1.
Figure 2C:
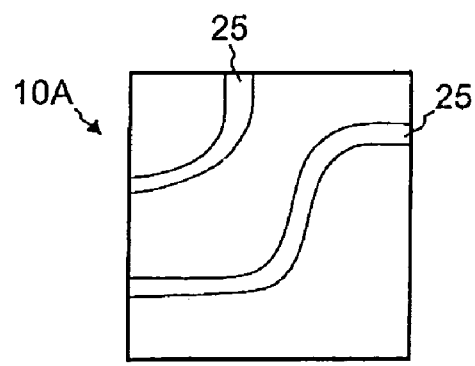
FIG. 2C shows a top view of another embodiment of the semiconductor device of FIG. 1.

Referring now to FIG. 2A, a top view of the device 10A is shown. In the embodiment shown in FIG. 2A, the portions 25 of the mold compound 24 is removed down a central area of the device 10A to form a channel and to provide compartmental RF shielding. The area of removal of the mold compound 24 in FIG. 2A is given as examples and should not be seen as to limit the scope of the present invention. For example, the mold compound 24 may be removed to form additional channels and compartmental shielding areas as shown in FIGS. 2B and 2C. As shown in FIG. 2C, the channels formed by the removal of the portions 25 of the mold compound 24 may be formed at various angles. The patterns formed in FIGS. 2A-2C are shown as examples and should not be seen in a limiting scope.

Figure 3A:
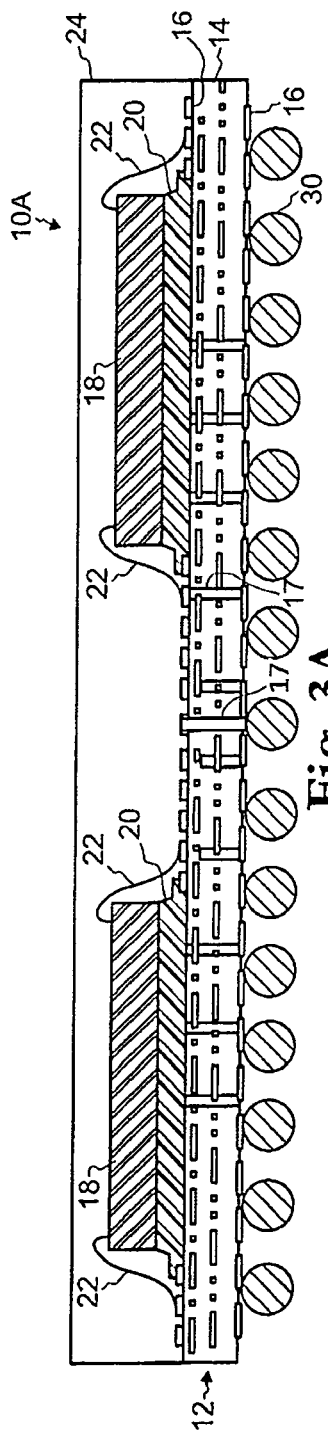
FIGS. 3A-3C shows a process of forming the semiconductor device of FIG. 1A.
Figure 3B:
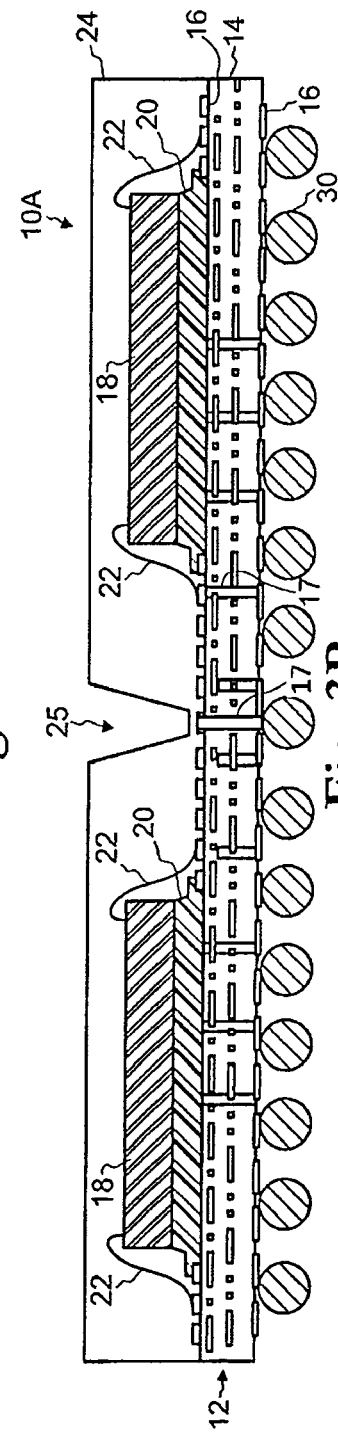
Figure 3C:
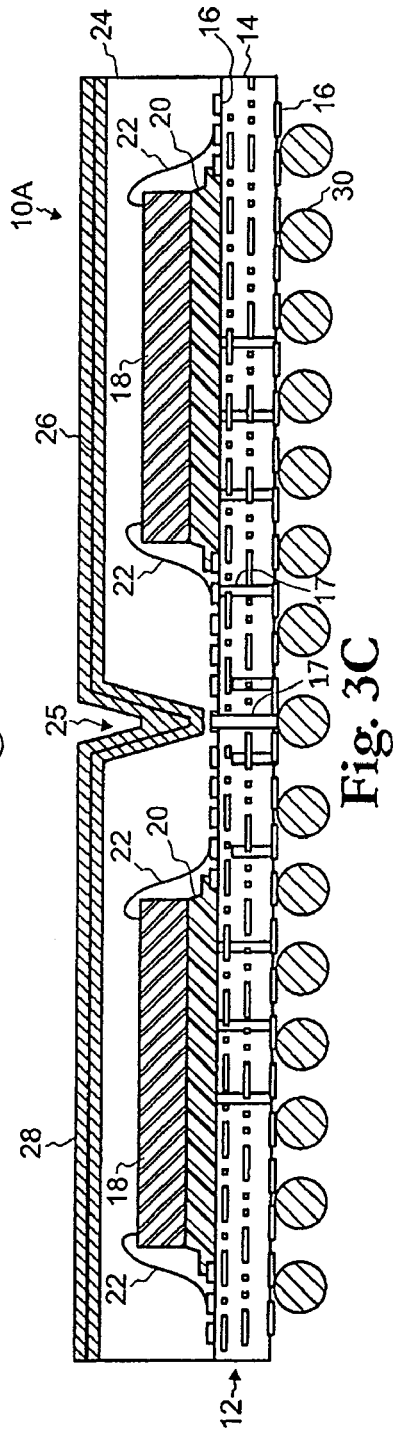

Referring to FIGS. 3A-3C, a method of forming the device 10A of FIG. 1A is shown. The device 10A may be assembled in strip fashion. Thus, a plurality of devices 10A may be formed from a single substrate strip. As shown in FIG. 3A, one or more electronic component 18 may be attached to a first surface of the first substrate 12. The electronic component 18 may be coupled to the first surface of the first substrate 12 in a plurality of different manners. In accordance with one embodiment, an adhesive 20 may be used to couple the electronic component 18 to the first substrate 12. The electronic component 18 is then electrically coupled to the first substrate 12 through the use of wirebonds 22. Alternatively, the electronic component 18 may be coupled to the substrate 12 through flip chip bonding, surface mount technology (SMT) or the like. The listing of the above coupling types should not be seen as to limit the scope of the present invention A mold compound 24 may be used to encapsulate the device 10A. The mold compound 24 may be made of a thermosetting plastic material like epoxy. The listing of the above types of mold compounds 24 should not be seen as to limit the scope of the present invention. The mold compound 24 may be used to encapsulate the components of the device 10A (i.e., electronic components 18), the wirebonds 22, and exposed areas of the first surface of the substrate 12.

Electrical contacts 30 may be coupled to a second surface of the substrate 16. The electrical contacts 30 may be a plurality of solder balls as shown in FIG. 3A, a plurality of leads, or the like. If solder balls are used, the solder balls may be electrically coupled to the second surface of the substrate 12. In general, a reflow process may be used to couple the solder balls to the second surface of the substrate 12. Alternative methods may be used to couple the leads to the substrate 16 without departing from the spirit and scope of the present invention.

As shown in FIG. 3B, portions 25 of the mold compound 24 may be removed between the electronic components 18. The mold compound 24 may be removed between the electronic components 18 to compartmentalized and provide EMI and RF shielding between the electronic components 18. The mold compound 24 may be compartmentalized any number of times to isolate any number of electronic components 18. In the embodiment shown in FIG. 3B, the mold compound 24 is removed between the electronic components 18 so that a small portion of mold compound 24 remains above the first surface of the substrate 12.

Referring to FIG. 3C, a conductive coating 26 may then be applied to the device 10A. The conductive coating 26 may be used to provide EMI shielding for the device 10A. The conductive coating 26 may be applied by plating, vacuum printing, vacuum deposition, insert molding, spray coating, and the like. The conductive coating 26 may be applied to the top surface of the mold compound 24. By removing portions of the mold compound 24 between the electronic components 18 and then applying the conductive coating 26, a compartmentalized EMI shield is formed between the electronic components 18. The smaller the gap between the electronic components 18, the more effective the EMI shield.

The conductive coating 26 may also be applied to side surfaces of the mold compound 24 and to side surfaces of the substrate 12 as shown in FIG. 1B. The conductive coating 26 may be attached to metal traces 16 which are exposed on side surfaces of the substrate 12. The conductive material 26 is applied so that the conductive material 26 will be in contact with the exposed metal traces 16. Thus, the semiconductor device 10A will have a conductive material 28 that contacts grounded metal. The above is given as an example regarding how the conductive coating 26 may be attached to the metal traces 16 at or near the side surface of the substrate 12 and should not be seen as to limit the scope of the present invention.

A non-conductive coating 28 may be applied to the conductive coating 26. The non-conductive coating 28 may be used as a protective layer to protect the conductive coating 26 and hence the device 10A from solvents, solders, fluxes, etc.

Figure 4A:
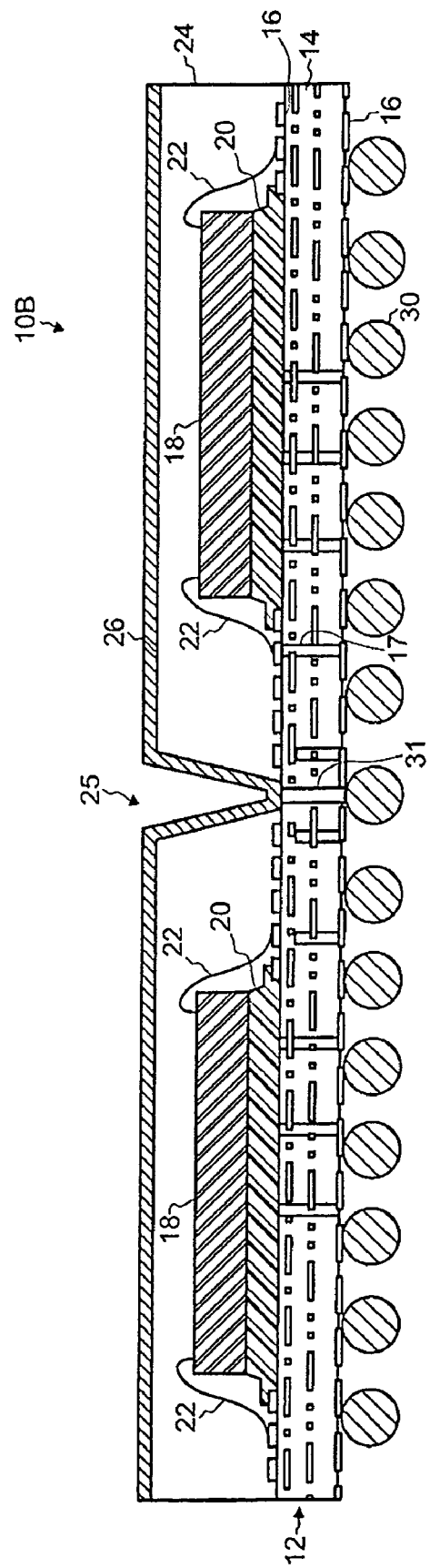
FIG. 4A is a cross-sectional side view of another embodiment of the semiconductor device of the present invention.

Referring to FIG. 4A, another embodiment of the device 10B is shown. The device 10B has a substrate 12. The substrate 12 may include an insulation layer 14 having predetermined area and thickness. The insulation layer 14 may have an approximately planar first surface and an approximately planar second surface opposing the first surface. The substrate 12 may have a plurality of metal traces 16 formed on the first surface of the insulation layer 14. A plurality of metal traces 16 may also be formed on the second surface of the insulation layer 14. If multiple layers of metal traces 16 are formed, a dielectric layer may be applied between the metal traces 16. The dielectric layer may be used as an insulating layer to separate two signal layers. The number of layers of metal traces 16 and insulation layers 14 is not limited to that shown in FIG. 4A. A soldermask may be placed over the top surface of the metal traces 16 formed on the substrate 12. The soldermask may be used to protect the metal traces 16. One or more vias 17 may be formed through the insulation layer 14. The vias 17 may be used as an interconnect to connect different layers of metal traces 16.

One or more electronic component 18 may be attached to a first surface of the first substrate 12. In the embodiment shown in FIG. 4A, two electronic components 18 are attached to a first surface of the first substrate 12. The electronic components 18 may be coupled to the first surface of the first substrate 12 in a plurality of different manners. In the embodiment shown in FIG. 4A, an adhesive 20 may be used to couple the electronic components 18 to the first substrate 12. The electronic components 18 may then be electrically coupled to the first substrate 12 through the use of wirebonds 22. Alternatively, the electronic components 18 may be coupled to the substrate 12 through flip chip bonding, surface mount technology (SMT) or the like. The listing of the above coupling types is given as an example and should not be seen as to limit the scope of the present invention.

A mold compound 24 may be used to encapsulate the device 10B. The mold compound 24 may be used to encapsulate the components of the device 10B (i.e., electronic components 18), the wirebonds 22, and exposed areas on the first surface of the substrate 12.

Portions 25 of the mold compound 24 may be removed between the electronic components 18. The mold compound 24 may be removed between the electronic components 18 to compartmentalized and provide EMI and RF shielding between the electronic components 18. The mold compound 24 may be compartmentalized any number of times to isolate any number of electronic components 18. In the embodiment shown in FIG. 4A, the mold compound 24 is removed between the electronic components 18 so that the first surface of the substrate 12 is exposed. As seen in FIG. 4A, a ground plane 31 on the substrate 12 is exposed. The ground plane 31 may be a grounded metal trace 16, a ground via or the like. In general, the mold compound 24 may be removed using a laser ablation process to expose the ground plane 31 while not damaging the substrate 12.

A conductive coating 26 may then be applied to the device 10B. The conductive coating 26 may be used to provide EMI shielding for the device 10B. The conductive coating 26 may be applied to the top surface of the mold compound 24 and to the ground plane exposed on the first surface of the substrate 12. By removing portions of the mold compound 24 between the electronic components 18 and then applying the conductive coating 26, a compartmentalized EMI shield is formed between the electronic components 18.

In accordance with one embodiment, the conductive coating 26 may also be applied to side surfaces of the mold compound 24 and to side surfaces of the substrate 12. The conductive coating 26 may be attached to metal traces 16 which are exposed on side surfaces of the substrate 12. The conductive material 26 is applied so that the conductive material 26 will be in contact with the exposed metal traces 16. The above listing is given as an example regarding how the conductive coating 24 may be attached to the metal traces 16 at or near the side surface of the substrate 12 and should not be seen as to limit the scope of the present invention.

A non-conductive coating (not shown) may be applied to the conductive coating 26. The non-conductive coating 28 may be used as a protective layer to protect the conductive coating 26 and hence the device 10A from solvents, solders, fluxes, etc.

Electrical contacts 30 may be coupled to a second surface of the substrate 16. The electrical contacts 30 may be a plurality of solder balls as shown in FIG. 4A, a plurality of leads, or the like. If solder balls are used, the solder balls may be electrically coupled to the second surface of the substrate 12. In general, a reflow process may be used to couple the solder balls to the second surface of the substrate 12. Alternative methods may be used to couple the leads to the substrate 16 without departing from the spirit and scope of the present invention.

Figure 4B:
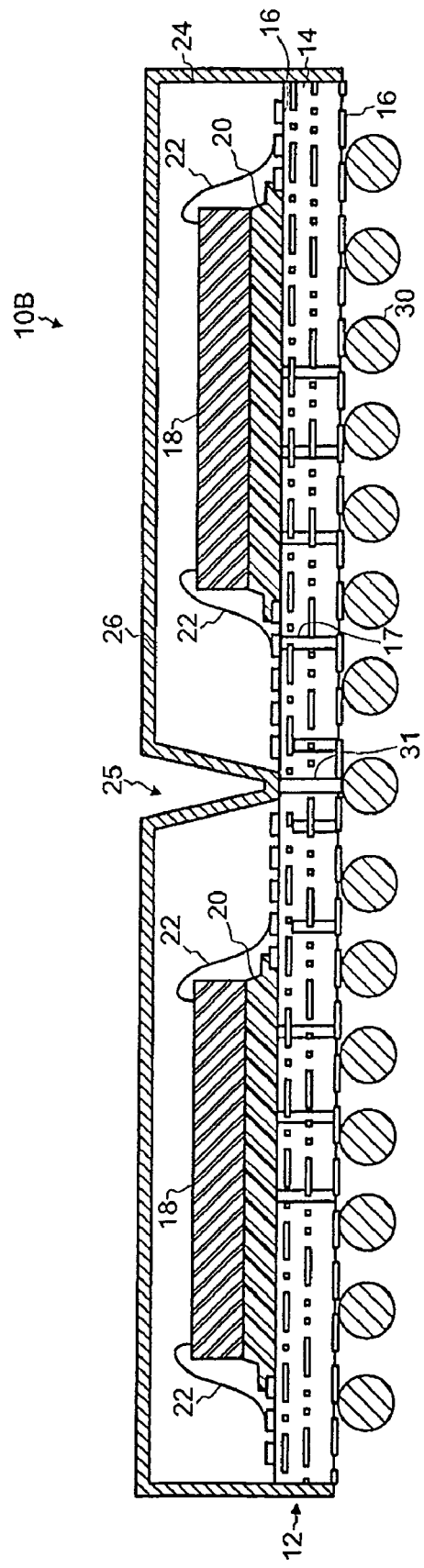
FIG. 4B is a cross-sectional side view of the embodiment of FIG. 4A showing one type of perimeter shield for the semiconductor device of the present invention.

Referring to FIG. 4B, the device 10B may provide compartmental and perimeter RF shielding. In FIG. 4B, the conductive coating 26 may be applied to side surfaces of the mold compound 24 and to side surfaces of the substrate 12. The conductive coating 26 may be attached to metal traces 16 which are exposed on side surfaces of the substrate 12. The exposed metal traces 16 will be ground planes. Thus, the semiconductor device 10B will have a conductive material 26 that contacts grounded metal to provide a perimeter RF shield.

Figure 4C:
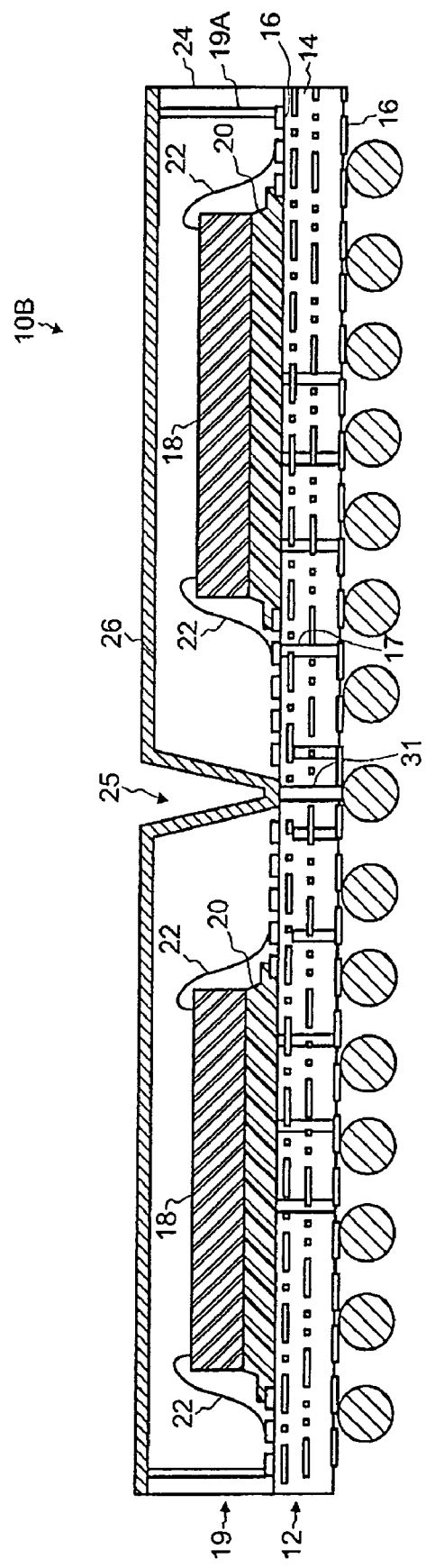
FIG. 4C is a cross-sectional side view of the embodiment of FIG. 4A showing another type of perimeter shield for the semiconductor device of the present invention.

Alternatively, as shown in FIG. 4C, the device 10B provides perimeter shielding by attaching a plurality of conductive devices 19 around a perimeter of the device 10B. In the present embodiment, the conductive devices 19 are wires 19A. However, other conductive devices 19 may be used without departing from the spirit and scope of the present invention. The wires 19A may have at least one end attached to a metal trace 16. Alternatively, both ends of the wire 19A may be attached to a metal trace 16. The metal trace 16 will generally be grounded. A section of the wire 19A will be exposed through the mold compound 24. The exposed portion of the wire 19A may contact the conductive coating 26.

Thus, the semiconductor device 10B will have a conductive material 26 that contacts grounded metal to provide a perimeter RF shield.

Figure 4D:
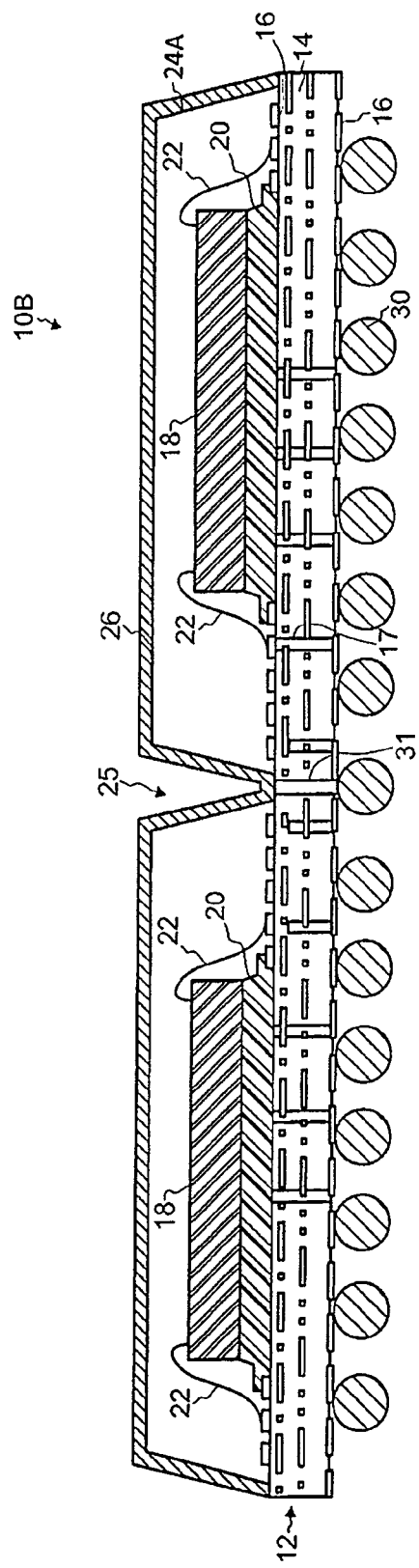
FIG. 4D is a cross-sectional side view of the embodiment of FIG. 4A showing another type of perimeter shield for the semiconductor device of the present invention.

Alternatively, as shown in FIG. 4D, the device 10B provides perimeter shielding by removing portions of the mold compound 24 to form side surfaces 24A. The mold compound 24 may be removed by a saw cut, laser ablation, or the like. The listing of the above is given as an example and should not be seen in a limiting scope. The conductive coating 26 may be applied to the top and side surfaces 24A of the mold compound 24 to form a perimeter RF shield.

Figure 4E:
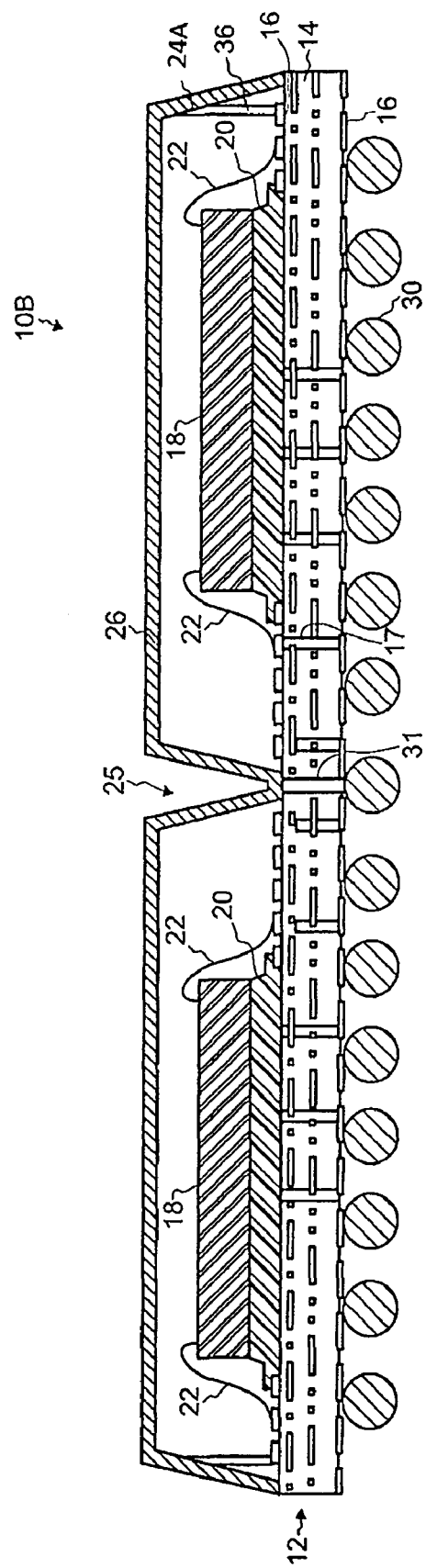
FIG. 4E is a cross-sectional side view of the embodiment of FIG. 4A showing another type of perimeter shield for the semiconductor device of the present invention.

Alternatively, as shown in FIG. 4E, ground wires 36 may be attached to metal traces 16. In the embodiment shown in FIG. 4E, the ground wires 36 are attached to metal traces 16 which are grounded. The ground wires 36 may be positioned around a perimeter of the device 10B. In the embodiment shown in FIG. 4E, the ground wires 36 may have a height which is less than a height of the electronic component 18. After the mold compound 24 encapsulates the device 10B, portions of the mold compound 24 may be removed so that a section of the ground wires 36 are exposed. In accordance with one embodiment, the mold compound 24 is removed to form angled side surfaces 24A on the mold compound 24. The top sections of the ground wires 36 are exposed on the angled surfaces 24A. It should be noted that the side surface 24A may or may not be angled and is given as an example and should not be seen as to limit the spirit and scope of the present invention. The conductive coating 26 may then be applied to the device 10B. The conductive coating 26 may be applied to the top surface of the mold compound 24 and to the sections of the ground wires 36 which are exposed. Thus, the semiconductor device 10B will have a conductive material 28 that contacts grounded metal.

FIGS. 4B-4E show different alternatives for providing perimeter shielding for the device 10B. The above is given as examples. Other methods of providing perimeter shielding for the device 10B may be sued without departing from the spirit and scope of the present invention.

Figure 5A:
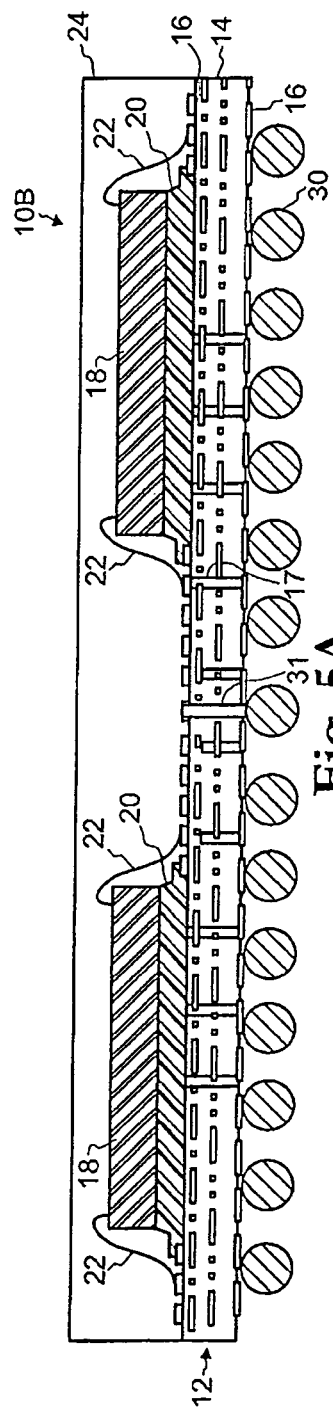
FIGS. 5A-5C shows a process of forming the semiconductor device of FIG. 4A.
Figure 5B:
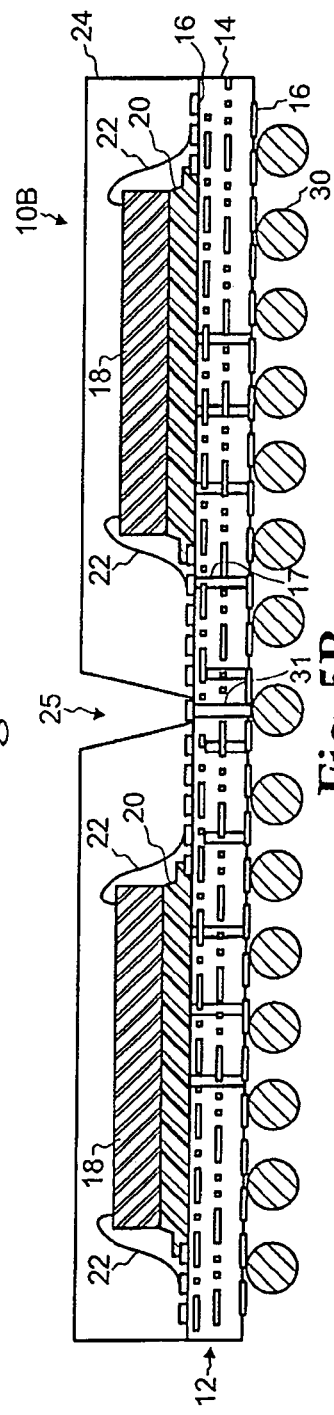
Figure 5C:
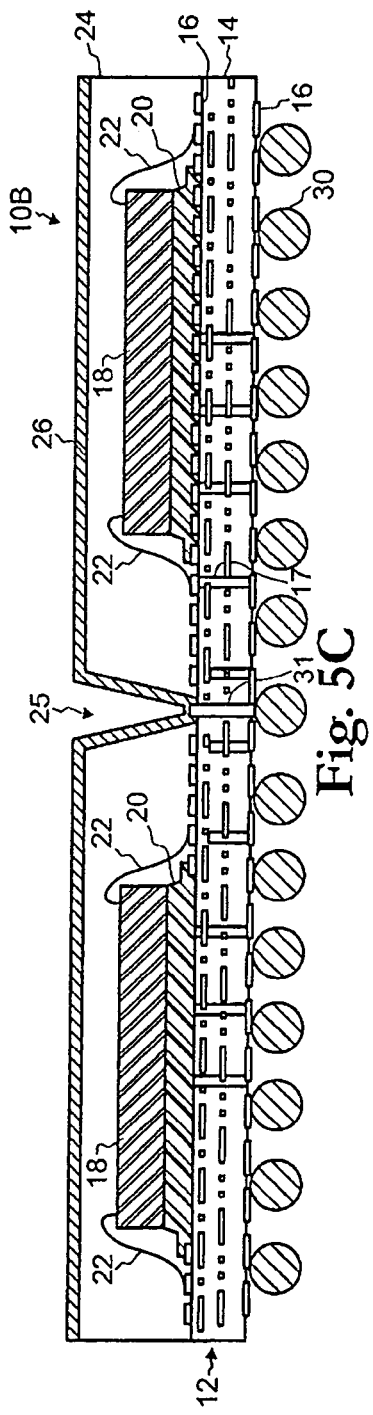

Referring to FIGS. 5A-5C, a method of forming the device 10B of FIG. 4A is shown. The device 10B may be assembled in strip fashion. Thus, a plurality of devices 10B may be formed from a single substrate strip. As shown in FIG. 5A, one or more electronic component 18 may be attached to a first surface of the first substrate 12. The electronic component 18 may be coupled to the first surface of the first substrate 12 in a plurality of different manners. In accordance with one embodiment, an adhesive 20 may be used to couple the electronic component 18 to the first substrate 12. The electronic component 18 is then electrically coupled to the first substrate 12 through the use of wirebonds 22. Alternatively, the electronic component 18 may be coupled to the substrate 12 through flip chip bonding, surface mount technology (SMT) or the like. The listing of the above coupling types is given as an example and should not be seen as to limit the scope of the present invention.

A mold compound 24 may be used to encapsulate the device 10B. The mold compound 24 may be made of a thermosetting plastic material like epoxy. The mold compound 24 may be used to encapsulate the components of the device 10B (i.e., electronic components 18), the wirebonds 22, and exposed areas of the first surface of the substrate 12.

Electrical contacts 30 may be coupled to a second surface of the substrate 16. The electrical contacts 30 may be a plurality of solder balls as shown in FIG. 5A, a plurality of leads, or the like. If solder balls are used, the solder balls may be electrically coupled to the second surface of the substrate 12. In general, a reflow process may be used to couple the solder balls to the second surface of the substrate 12. Alternative methods may be used to couple the leads to the substrate 16 without departing from the spirit and scope of the present invention.

As shown in FIG. 5B, portions 25 of the mold compound 24 may be removed between the electronic components 18. The mold compound 24 may be removed between the electronic components 18 to compartmentalized and provide EMI and RF shielding between the electronic components 18. The mold compound 24 may be compartmentalized any number of times to isolate any number of electronic components 18. In the embodiment shown in FIG. 3B, the mold compound 24 is removed between the electronic components 18 to expose a ground plane 31 on the first surface of the substrate 12.

Referring to FIG. 5C, a conductive coating 26 may then be applied to the device 10B. The conductive coating 26 may be used to provide EMI shielding for the device 10A. The conductive coating 26 may be applied to the top surface of the mold compound 24 and to the ground plane 31 exposed on the first surface of the substrate 12. By removing portions of the mold compound 24 between the electronic components 18 and then applying the conductive coating 26, a compartmentalized EMI shield is formed between the electronic components 18.

The conductive coating 26 may also be applied to side surfaces of the mold compound 24 and to side surfaces of the substrate 12. The conductive coating 26 may be attached to metal traces 16 which are exposed on side surfaces of the substrate 12. The conductive material 26 is applied so that the conductive material 26 will be in contact with the exposed metal traces 16. Thus, the semiconductor device 10B will have a conductive material 28 that contacts grounded metal. The above listing is given as an example regarding how the conductive coating 26 may be attached to the metal traces 16 at or near the side surface of the substrate 12 and should not be seen as to limit the scope of the present invention.

A non-conductive coating (not shown) may be applied to the conductive coating 26. The non-conductive coating may be used as a protective layer to protect the conductive coating 26 and hence the device 10B from solvents, solders, fluxes, etc.

Figure 6A:
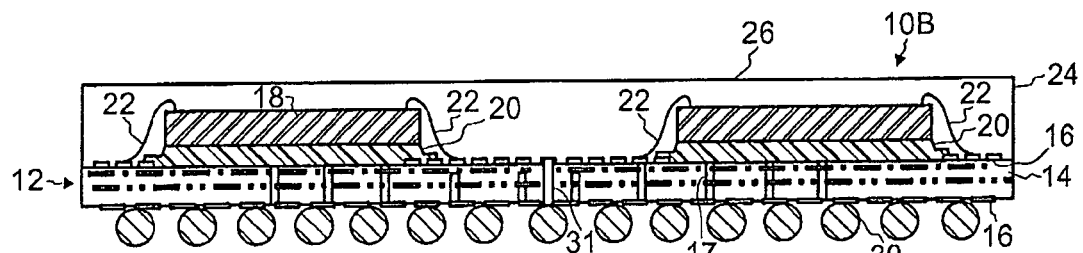
FIGS. 6A-6D shows a process of forming the semiconductor device of FIG. 4A.
Figure 6B:
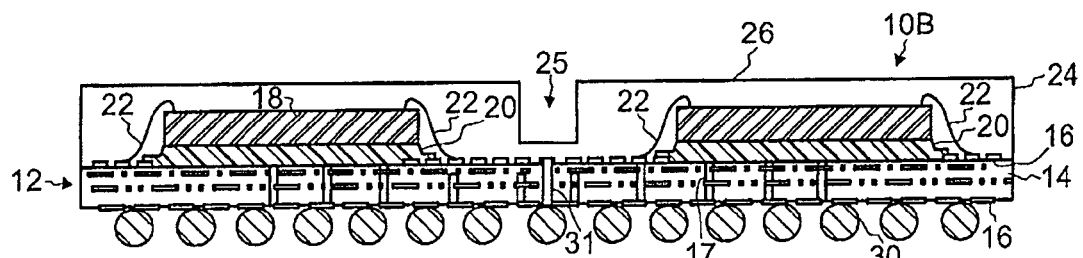
Figure 6C:
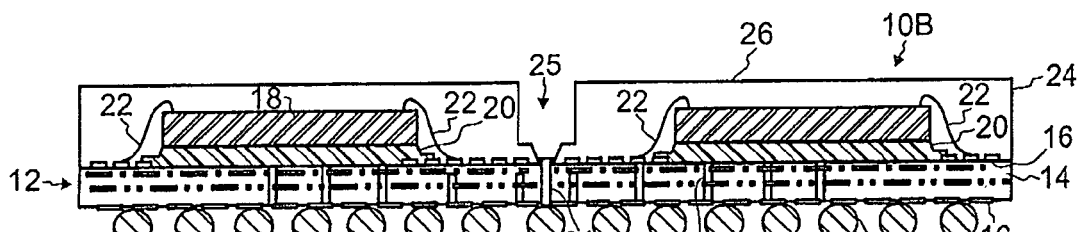

Referring to FIGS. 6A-6C, another method of forming the device 10B is shown. As shown in FIG. 6A, one or more electronic component 18 may be attached to a first surface of the first substrate 12. The electronic component 18 may be coupled to the first surface of the first substrate 12 in a plurality of different manners. In accordance with one embodiment, an adhesive 20 may be used to couple the electronic component 18 to the first substrate 12. The electronic component 18 is then electrically coupled to the first substrate 12 through the use of wirebonds 22. Alternatively, the electronic component 18 may be coupled to the substrate 12 through flip chip bonding, surface mount technology (SMT) or the like. The listing of the above coupling types is given as an example and should not be seen as to limit the scope of the present invention.

A mold compound 24 may be used to encapsulate the device 10B. The mold compound 24 may be made of a thermosetting plastic material like epoxy. The mold compound 24 may be used to encapsulate the components of the device 10B (i.e., electronic components 18), the wirebonds 22, and exposed areas of the first surface of the substrate 12.

Electrical contacts 30 may be coupled to a second surface of the substrate 16. The electrical contacts 30 may be a plurality of solder balls as shown in FIG. 6A, a plurality of leads, or the like. If solder balls are used, the solder balls may be electrically coupled to the second surface of the substrate 12.

In general, a reflow process may be used to couple the solder balls to the second surface of the substrate 12. Alternative methods may be used to couple the leads to the substrate 16 without departing from the spirit and scope of the present invention.

As shown in FIG. 6B, a first portion 25A of the mold compound 24 may be removed between the electronic components 18. In the embodiment shown in FIG. 6B, the mold compound 24 is removed between the electronic components 18 so that a small portion of mold compound 24 remains above the first surface of the substrate 12. In general, a mechanical saw process may be used to remove the mold compound between the electronic components 18.

Referring to FIG. 6C, a second portion 25B of the mold compound 24 that remains above the first surface of the substrate 12 are removed to expose the metal traces 16 on the first surface of the substrate 12. The portions of the mold compound 24 that remains above the first surface of the substrate 12 may be removed using a laser ablation process to expose the metal traces 16 while not damaging the substrate 12. The exposed metal traces 16 may be coupled to a ground plane 31.

Figure 6D:
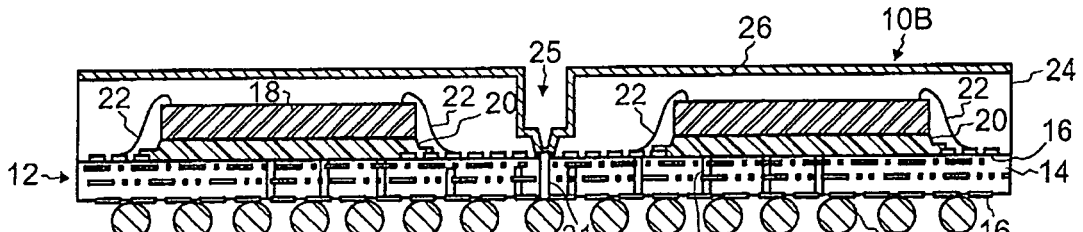

Referring to FIG. 6D, a conductive coating 26 may then be applied to the device 10B. The conductive coating 26 may be used to provide EMI shielding for the device 10B. The conductive coating 26 may be applied to the top surface of the mold compound 24 and to the metal traces 16 exposed on the first surface of the substrate 12. By removing portions of the mold compound 24 between the electronic components 18 and then applying the conductive coating 26, a compartmentalized EMI shield is formed between the electronic components 18.

The conductive coating 26 may also be applied to side surfaces of the mold compound 24 and to side surfaces of the substrate 12. The conductive coating 26 may be attached to metal traces 16 which are exposed on side surfaces of the substrate 12. The conductive material 26 is applied so that the conductive material 26 will be in contact with the exposed metal traces 16. The above listing is given as an example regarding how the conductive coating 26 may be attached to metal traces 16 at or near the side surface of the substrate 12 and should not be seen as to limit the scope of the present invention.

A non-conductive coating (not shown) may be applied to the conductive coating 26. The non-conductive coating 28 may be used as a protective layer to protect the conductive coating 26 and hence the device 10B from solvents, solders, fluxes, etc.

Figure 7A:
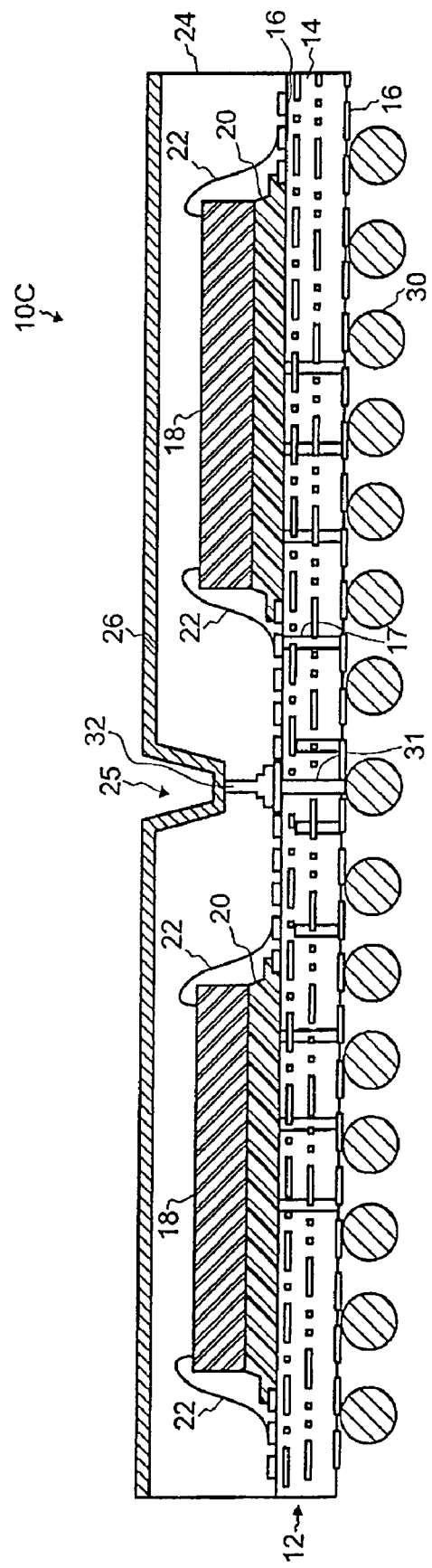
FIG. 7A is a cross-sectional side view of another embodiment of the semiconductor device of the present invention.

Referring to FIG. 7A, another embodiment of the device 10C is shown. The device 10C has a substrate 12. The substrate 12 may include an insulation layer 14 having predetermined area and thickness. The insulation layer 14 may have an approximately planar first surface and an approximately planar second surface opposing the first surface. The substrate 12 may have a plurality of metal traces 16 formed on the first surface of the insulation layer 14. A plurality of metal traces 16 may also be formed on the second surface of the insulation layer 14. If multiple layers of metal traces 16 are formed, a dielectric layer may be applied between the metal traces 16. The dielectric layer may be used as an insulating layer to separate two signal layers. The number of multiple layers of metal traces 16 and insulation layers 14 is not limited to that shown in FIG. 7A. A soldermask may be placed over the top surface of the metal traces 16 formed on the substrate 12. The soldermask may be used to protect the metal traces 16. One or more vias 17 may be formed through the insulation layer 14. The vias 17 may be used as an interconnect to connect different layers of metal traces 16.

One or more electronic component 18 may be attached to a first surface of the first substrate 12. In the embodiment shown in FIG. 7A, two electronic components 18 are attached to a first surface of the first substrate 12. The electronic components 18 may be coupled to the first surface of the first substrate 12 in a plurality of different manners. In the embodiment shown in FIG. 7A, an adhesive 20 may be used to couple the electronic components 18 to the first substrate 12. The electronic components 18 may then be electrically coupled to the first substrate 12 through the use of wirebonds 22. Alternatively, the electronic components 18 may be coupled to the substrate 12 through flip chip bonding, surface mount technology (SMT) or the like. The listing of the above coupling types should not be seen as to limit the scope of the present invention.

A ground connection 32 is attached to a metal trace 16. The ground connection 32 may be a pin, wire, or any other conductive material. The listing of the above types of ground connection 32 should not be seen as to limit the scope of the present invention. In the embodiment shown in FIG. 7A, the ground connection 32 is positioned between the electronic components 18. A ground via 31 may be connected to the metal traces 16 and the ground connection 32.

A mold compound 24 may be used to encapsulate the device 10C. The mold compound 24 may be used to encapsulate the components of the device 10C (i.e., electronic components 18), the wirebonds 22, and exposed areas on the first surface of the substrate 12.

Portions 25 of the mold compound 24 may be removed between the electronic components 18. The mold compound 24 may be removed between the electronic components 18 to compartmentalize and provide EMI and RF shielding between the electronic components 18. The mold compound 24 may be compartmentalized any number of times to isolate any number of electronic components 18. In the embodiment shown in FIG. 7A, the mold compound 24 is removed between the electronic components 18 so that a top section of the ground connection 32 is exposed. In general, the mold compound 24 may be removed using a mechanical saw process. However, other methods may be used to remove the mold compound 24 between the electronic components 18 to expose the top section of the ground connection 32 without departing from the spirit and scope of the present invention.

A conductive coating 26 may then be applied to the device 10C. The conductive coating 26 may be used to provide EMI shielding for the device 10C. The conductive coating 26 may be applied to the top surface of the mold compound 24 and to the top section of the ground connection 32 which is exposed. By removing portions of the mold compound 24 between the electronic components 18 and then applying the conductive coating 26, a compartmentalized grounded EMI shield is formed between the electronic components 18.

In accordance with one embodiment, the conductive coating 26 may also be applied to side surfaces of the mold compound 24 and to side surfaces of the substrate 12. The conductive coating 26 may be attached to metal traces 16 which are exposed on side surfaces of the substrate 12. The conductive material 26 is applied so that the conductive material 26 will be in contact with the exposed metal traces 16. Thus, the semiconductor device 10C will have a conductive material 28 that contacts grounded metal. The above listing is given as an example regarding how the conductive coating 26 may be attached to the metal traces 16 at or near the side surface of the substrate 12 and should not be seen as to limit the scope of the present invention.

A non-conductive coating (not shown) may be applied to the conductive coating 26. The non-conductive coating may be used as a protective layer to protect the conductive coating 26 and hence the device 10C from solvents, solders, fluxes, etc.

Electrical contacts 30 may be coupled to a second surface of the substrate 16. The electrical contacts 30 may be a plurality of solder balls as shown in FIG. 7A, a plurality of leads, or the like. If solder balls are used, the solder balls may be electrically coupled to the second surface of the substrate 12. In general, a reflow process may be used to couple the solder balls to the second surface of the substrate 12. Alternative methods may be used to couple the leads to the substrate 16 without departing from the spirit and scope of the present invention.

Figure 7B:
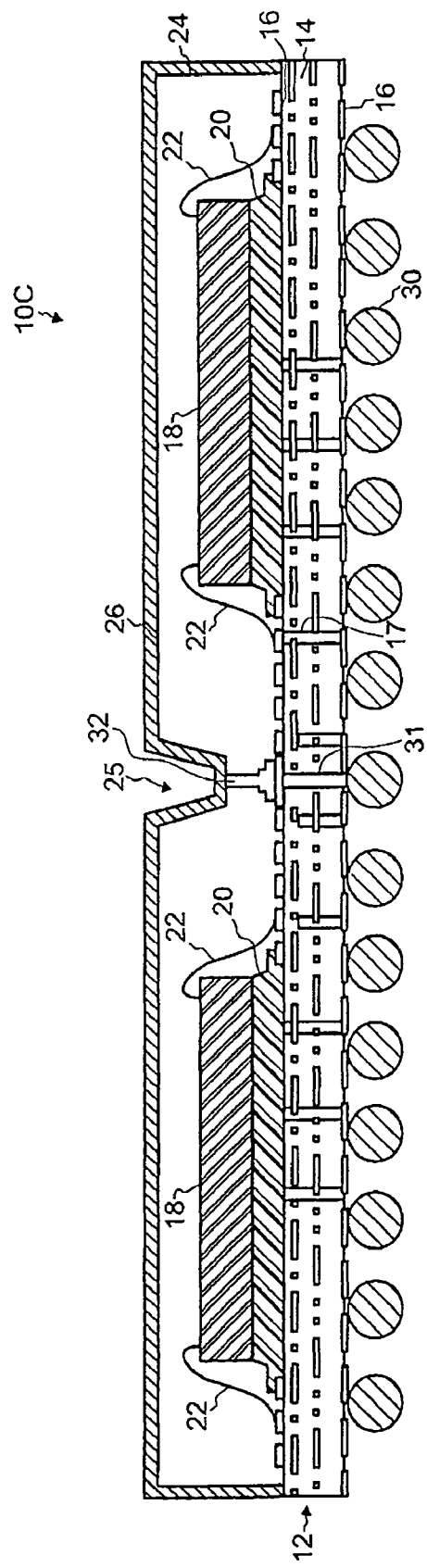
FIG. 7B is a cross-sectional side view of the embodiment of FIG. 7A showing one type of perimeter shield for the semiconductor device of the present invention.

Referring to FIG. 7B, the device 10*c* may provide compartmental and perimeter RF shielding. In FIG. 7B, the conductive coating 26 may be applied to side surfaces of the mold compound 24 and to side surfaces of the substrate 12. The conductive coating 26 may be attached to metal traces 16 which are exposed on side surfaces of the substrate 12. The exposed metal traces 16 will be ground planes. Thus, the semiconductor device 10C will have a conductive material 26 that contacts grounded metal to provide a perimeter RE shield.

Figure 7C:
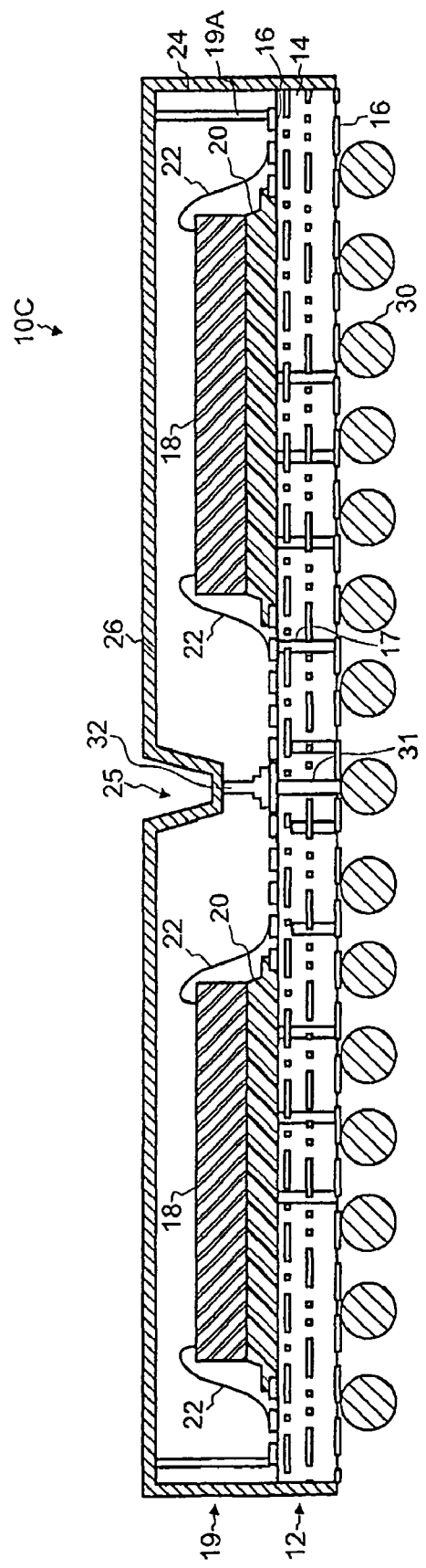
FIG. 7C is a cross-sectional side view of the embodiment of FIG. 7A showing another type of perimeter shield for the semiconductor device of the present invention.

Alternatively, as shown in FIG. 7C, the device 10C provides perimeter shielding by attaching a plurality of conductive devices 19 around a perimeter of the device 10C. In the present embodiment, the conductive devices 19 are wires 19A. However, other conductive devices 19 may be used without departing from the spirit and scope of the present invention. The wires 19A may have at least one end attached to a metal trace 16. Alternatively, both ends of the wire 19A may be attached to a metal trace 16. The metal trace 16 will generally be grounded. A section of the wire 19A will be exposed through the mold compound 24. The exposed portion of the wire 19A may contact the conductive coating 26. Thus, the semiconductor device 10B will have a conductive material 26 that contacts grounded metal to provide a perimeter RE shield.

Figure 7D:
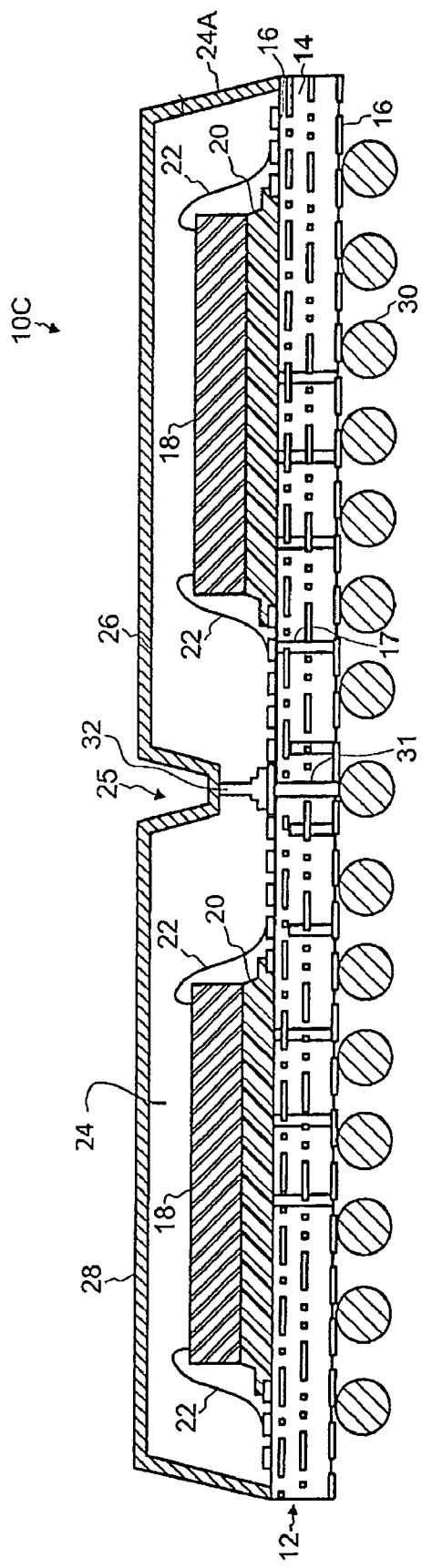
FIG. 7D is a cross-sectional side view of the embodiment of FIG. 7A showing another type of perimeter shield for the semiconductor device of the present invention.

Alternatively, as shown in FIG. 7D, the device 10C provides perimeter shielding by removing portions of the mold compound 24 to form side surfaces 24A. The mold compound 24 may be removed by a saw cut, laser ablation, or the like. The listing of the above is given as an example and should not be seen in a limiting scope. The conductive coating 26 may be applied to the top and side surfaces 21 of the mold compound 24 to form a perimeter RF shield.

Figure 7E:
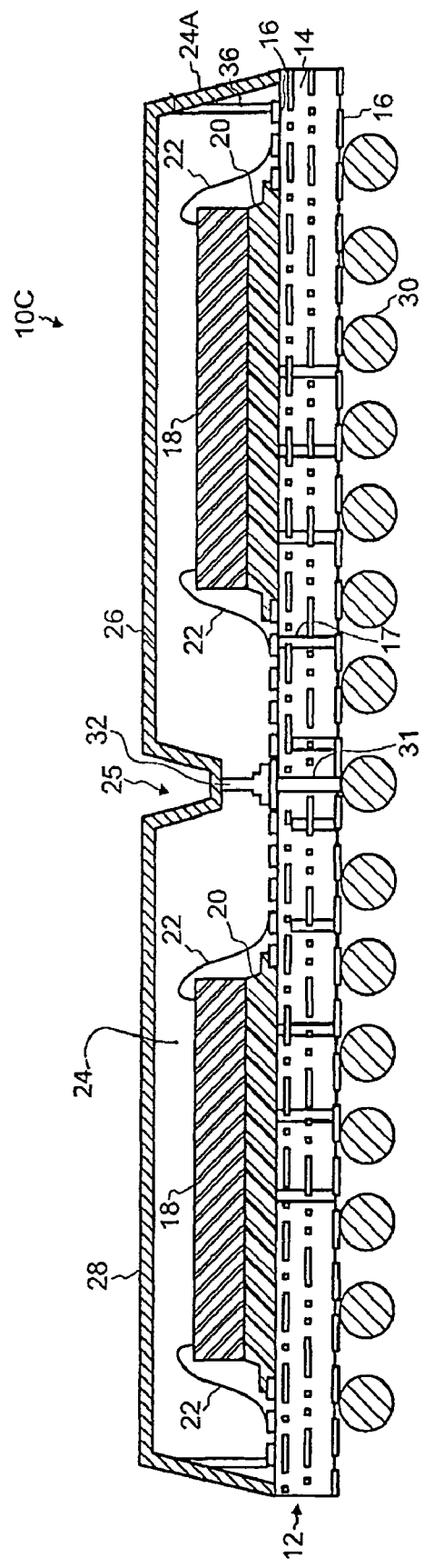
FIG. 7E is a cross-sectional side view of the embodiment of FIG. 7A showing another type of perimeter shield for the semiconductor device of the present invention.

Alternatively, as shown in FIG. 7E, ground wires 36 may be attached to metal traces 16. In the embodiment shown in FIG. 7E, the ground wires 36 are attached to metal traces 16 which are grounded. The ground wires 36 may be positioned around a perimeter of the device 10C. In the embodiment shown in FIG. 7E, the ground wires 36 may have a height which is less than a height of the electronic component 18. After the mold compound 24 encapsulates the device 10C, portions of the mold compound 24 may be removed so that a section of the ground wires 36 are exposed. In accordance with one embodiment, the mold compound 24 is removed to form angled side surfaces 24A on the mold compound 24. The top sections of the ground wires 36 are exposed on the angled surfaces 24A. The conductive coating 26 may then be applied to the device 10C. It should be noted that the side surface 24A may or may not be angled and is given as an example and should not be seen as to limit the spirit and scope of the present invention. The conductive coating 26 may be applied to the top surface of the mold compound 24 and to the sections of the ground wires 36 which are exposed. Thus, the semiconductor device 10C will have a conductive material 28 that contacts grounded metal.

FIGS. 7B-7E show different alternatives for providing perimeter shielding for the device 10B. The above is given as examples. Other methods of providing perimeter shielding for the device 10B may be sued without departing from the spirit and scope of the present invention.

Figure 8A:
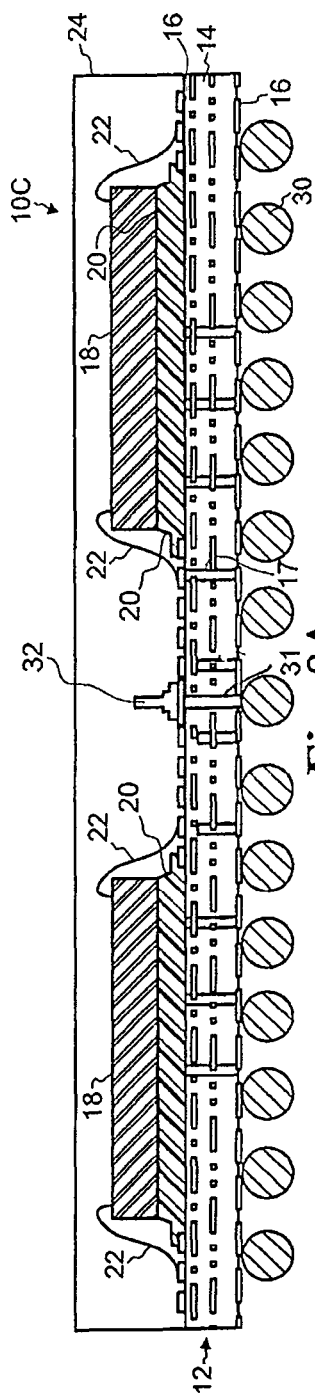
FIGS. 8A-8C shows a process of forming the semiconductor device of FIG. 7.
Figure 8B:
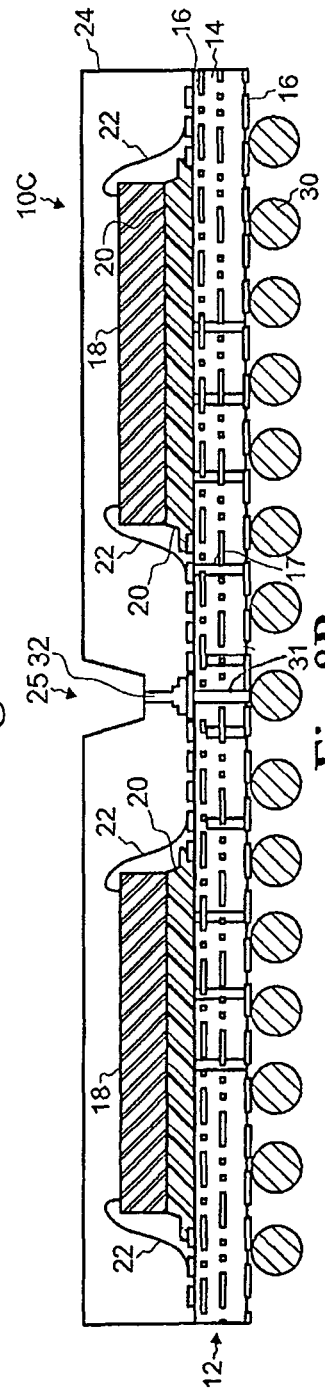
Figure 8C:
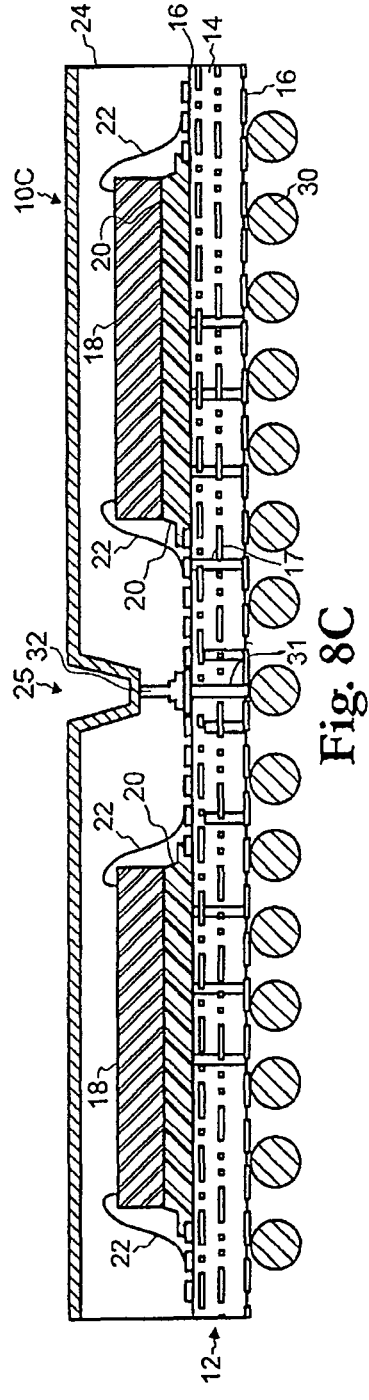

Referring to FIGS. 8A-8C, a method of forming the device 10C of FIG. 7A is shown. The device 10C may have a substrate 12. The substrate 12 may include an insulation layer 14 having predetermined area and thickness. The insulation layer 14 may have an approximately planar first surface and an approximately planar second surface opposing the first surface. The substrate 12 may have a plurality of metal traces 16 formed on the first surface of the insulation layer 14. A plurality of metal traces 16 may also be formed on the second surface of the insulation layer 14. If multiple layers of metal traces 16 are formed, a dielectric layer may be applied between the metal traces 16. The dielectric layer may be used as an insulating layer to separate two signal layers. The number of layers of metal traces 16 and insulation layers 14 is not limited to the number shown in FIGS. 8A-8C. A soldermask may be placed over the top surface of the metal traces 16 formed on the substrate 12. The soldermask may be used to protect the metal traces 16. One or more vias 17 may be formed through the insulation layer 14. The vias 17 may be used as an interconnect to connect different layers of metal traces 16.

One or more electronic component 18 may be attached to a first surface of the first substrate 12. In the embodiment shown in FIG. 8A, two electronic components 18 are attached to a first surface of the first substrate 12. The electronic components 18 may be coupled to the first surface of the first substrate 12 in a plurality of different manners. In the embodiment shown in FIG. 8A, an adhesive 20 may be used to couple the electronic components 18 to the first substrate 12. The electronic components 18 may then be electrically coupled to the first substrate 12 through the use of wirebonds 22. Alternatively, the electronic components 18 may be coupled to the substrate 12 through flip chip bonding, surface mount technology (SMT) or the like. The listing of the above coupling types should not be seen as to limit the scope of the present invention.

A ground connection 32 is attached to a metal trace 16. In the embodiment shown in FIG. 8A, the ground connection 32 is attached to and positioned between the electronic components 18. A ground via 31 may be connected to the metal traces 16 and the ground connection 32.

A mold compound 24 may be used to encapsulate the device 10C. The mold compound 24 may be used to encapsulate the components of the device 10C (i.e., electronic components 18), the wirebonds 22, and exposed areas on the first surface of the substrate 12.

Electrical contacts 30 may be coupled to a second surface of the substrate 16. The electrical contacts 30 may be a plurality of solder balls as shown in FIG. 8A, a plurality of leads, or the like. If solder balls are used, the solder balls may be electrically coupled to the second surface of the substrate 12. In general, a reflow process may be used to couple the solder balls to the second surface of the substrate 12. Alternative methods may be used to couple the leads to the substrate 16 without departing from the spirit and scope of the present invention.

Referring to FIG. 8B, portions 25 of the mold compound 24 may be removed between the electronic components 18. The mold compound 24 may be removed between the electronic components 18 to compartmentalized and provide EMI and RF shielding between the electronic components 18. In the embodiment shown in FIG. 8B, the mold compound 24 is removed between the electronic components 18 so that a top section of the ground connection 32 is exposed. In general, the mold compound 24 may be removed using a mechanical saw process. However, other methods may be used to remove the mold compound 24 between the electronic components 18 to expose the top section of the ground connection 32 without departing from the spirit and scope of the present invention.

Referring to FIG. 8C, a conductive coating 26 may then be applied to the device 10C. The conductive coating 26 may be used to provide EMI shielding for the device 10C. The conductive coating 26 may be applied to the top surface of the mold compound 24 and to the top section of the ground pin 32 which is exposed. By removing portions of the mold compound 24 between the electronic components 18 and then applying the conductive coating 26, a compartmentalized grounded EMI shield is formed between the electronic components 18.

In accordance with one embodiment, the conductive coating 26 may also be applied to side surfaces of the mold compound 24 and to side surfaces of the substrate 12. The conductive coating 26 may be attached to metal traces 16 which are exposed on side surfaces of the substrate 12. The conductive material 26 is applied so that the conductive material 26 will be in contact with the exposed metal traces 16. The above listing is given as an example regarding how the conductive coating 26 may be attached to metal traces 16 at or near the side surface of the substrate 12 and should not be seen as to limit the scope of the present invention.

A non-conductive coating (not shown) may be applied to the conductive coating 26. The non-conductive coating may be used as a protective layer to protect the conductive coating 26 and hence the device 10C from solvents, solders, fluxes, etc.

Figure 9A:
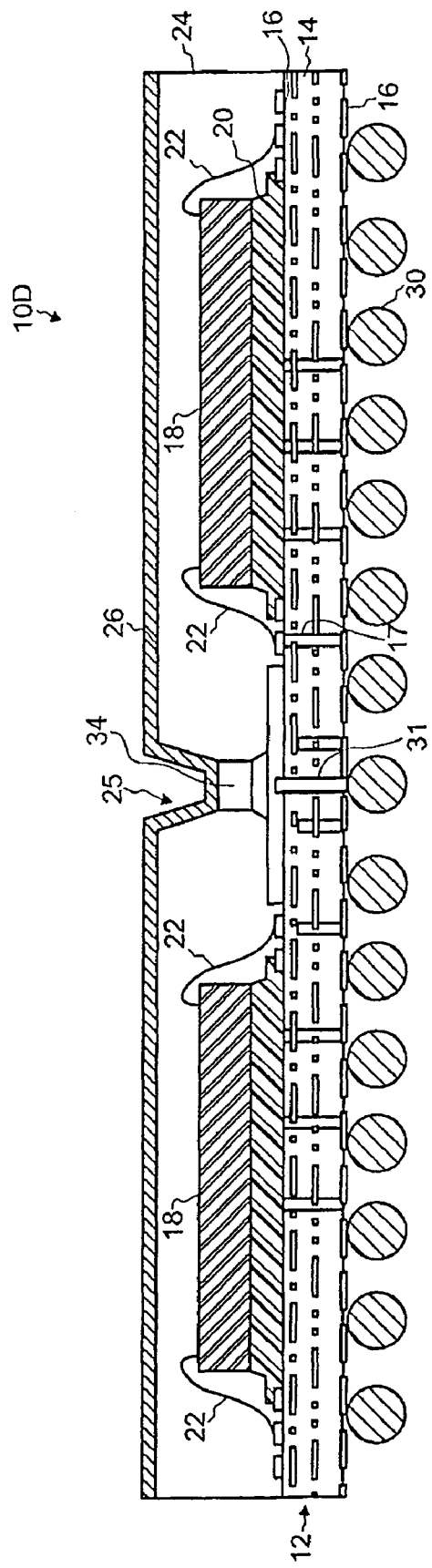
FIG. 9A is a cross-sectional side view of another embodiment of the semiconductor device of the present invention.

Referring to FIG. 9A, another embodiment of the device 10D is shown. The device 10D has a substrate 12. The substrate 12 may include an insulation layer 14 having predetermined area and thickness. The insulation layer 14 may have an approximately planar first surface and an approximately planar second surface opposing the first surface. The substrate 12 may have a plurality of metal traces 16 formed on the first surface of the insulation layer 14. A plurality of metal traces 16 may also be formed on the second surface of the insulation layer 14. If multiple layers of metal traces 16 are formed, a dielectric layer may be applied between the metal traces 16. The dielectric layer may be used as an insulating layer to separate two signal layers. The number of multiple layers of metal traces 16 and insulation layers 14 is not limited to the number shown in FIG. 9A. A soldermask may be placed over the top surface of the metal traces 16 formed on the substrate 12. The soldermask may be used to protect the metal traces 16. One or more vias 17 may be formed through the insulation layer 14. The vias 17 may be used as an interconnect to connect different layers of metal traces 16.

One or more electronic component 18 may be attached to a first surface of the first substrate 12. In the embodiment shown in FIG. 9A, two electronic components 18 are attached to a first surface of the first substrate 12. The electronic components 18 may be coupled to the first surface of the first substrate 12 in a plurality of different manners. In the embodiment shown in FIG. 9A, an adhesive 20 may be used to couple the electronic components 18 to the first substrate 12. The electronic components 18 may then be electrically coupled to the first substrate 12 through the use of wirebonds 22. Alternatively, the electronic components 18 may be coupled to the substrate 12 through flip chip bonding, surface mount technology (SMT) or the like. The listing of the above coupling types should not be seen as to limit the scope of the present invention.

A ground pad 34 is attached to a metal trace 16. In the embodiment shown in FIG. 9A, the ground pad 34 is attached to and positioned between the electronic components 18. A ground via 31 may be connected to the metal traces 16 and the ground pad 34. The ground pad 34 may be a conductive material or component. The listing of the ground pad types should not be seen as to limit the scope of the present invention.

A mold compound 24 may be used to encapsulate the device 10D. The mold compound 24 may be used to encapsulate the components of the device 10D (i.e., electronic components 18), the wirebonds 22, and exposed areas on the first surface of the substrate 12.

Portions 25 of the mold compound 24 may be removed between the electronic components 18. The mold compound 24 may be removed between the electronic components 18 to compartmentalize and provide EMI and RF shielding between the electronic components 18. The mold compound 24 may be compartmentalized any number of times to isolate any number of electronic components 18. In the embodiment shown in FIG. 9A, the mold compound 24 is removed between the electronic components 18 so that a top section of the ground pad 34 is exposed. In general, the mold compound 24 may be removed using a mechanical saw process. However, other methods may be used to remove the mold compound 24 between the electronic components 18 to expose the top section of the ground pin 32 without departing from the spirit and scope of the present invention.

A conductive coating 26 may then be applied to the device 10D. The conductive coating 26 may be used to provide EMI shielding for the device 10D. The conductive coating 26 may be applied to the top surface of the mold compound 24 and to the top section of the ground pad 34 which is exposed. By removing portions of the mold compound 24 between the electronic components 18 and then applying the conductive coating 26, a compartmentalized grounded EMI shield is formed between the electronic components 18.

In accordance with one embodiment, the conductive coating 26 may also be applied to side surfaces of the mold compound 24 and to side surfaces of the substrate 12. The conductive coating 26 may be attached to metal traces 16 which are exposed on side surfaces of the substrate 12. The conductive material 26 is applied so that the conductive material 26 will be in contact with the exposed metal traces 16. Thus, the semiconductor device 10D will have a conductive material 28 that contacts grounded metal. The above listing is given as an example regarding how the conductive coating 26 may be attached to metal traces 16 at or near the side surface of the substrate 12 and should not be seen as to limit the scope of the present invention.

A non-conductive coating (not shown) may be applied to the conductive coating 26. The non-conductive coating 28 may be used as a protective layer to protect the conductive coating 26 and hence the device 10D from solvents, solders, fluxes, etc.

Electrical contacts 30 may be coupled to a second surface of the substrate 16. The electrical contacts 30 may be a plurality of solder balls as shown in FIG. 9A, a plurality of leads, or the like. If solder balls are used, the solder balls may be electrically coupled to the second surface of the substrate 12. In general, a reflow process may be used to couple the solder balls to the second surface of the substrate 12. Alternative methods may be used to couple the leads to the substrate 16 without departing from the spirit and scope of the present invention.

Figure 9B:
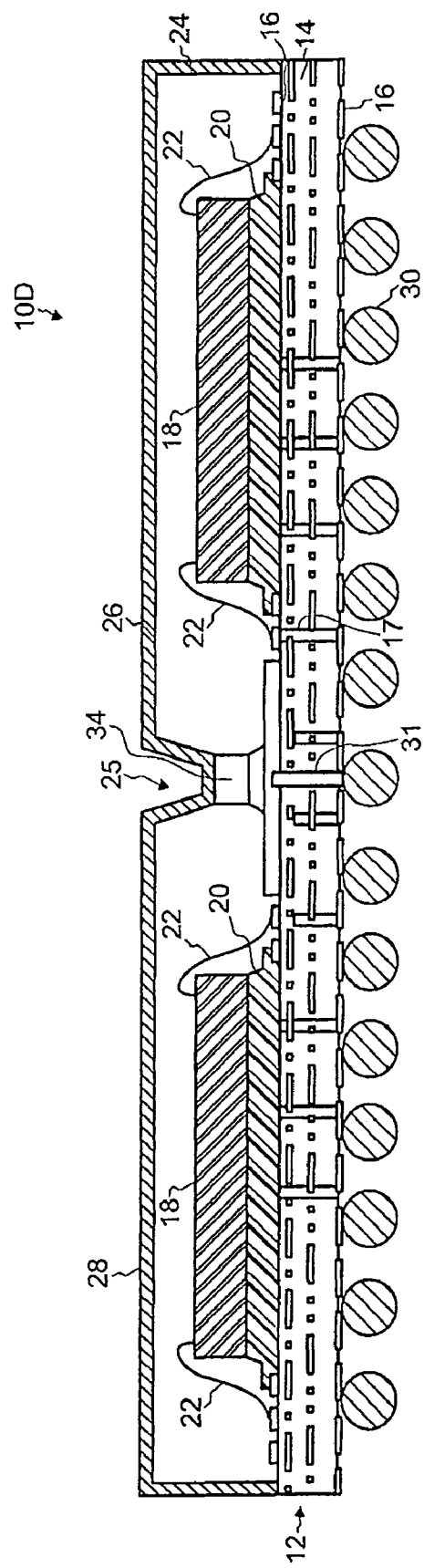
FIG. 9B is a cross-sectional side view of the embodiment of FIG. 9A showing one type of perimeter shield for the semiconductor device of the present invention.

Referring to FIG. 9B, the device 10D may provide compartmental and perimeter RF shielding. In FIG. 9B, the conductive coating 26 may be applied to side surfaces of the mold compound 24 and to side surfaces of the substrate 12. The conductive coating 26 may be attached to metal traces 16 which are exposed on side surfaces of the substrate 12. The exposed metal traces 16 will be ground planes. Thus, the semiconductor device 10D will have a conductive material 26 that contacts grounded metal to provide a perimeter RF shield.

Figure 9C:
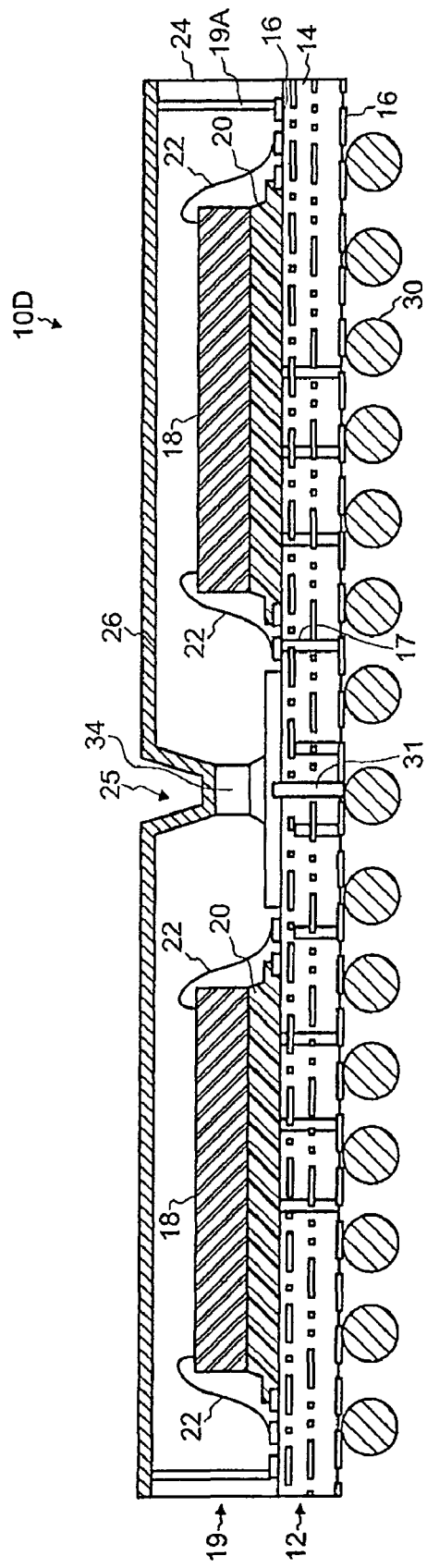
FIG. 9C is a cross-sectional side view of the embodiment of FIG. 9A showing another type of perimeter shield for the semiconductor device of the present invention.

Alternatively, as shown in FIG. 9C, the device 10D provides perimeter shielding by attaching a plurality of conductive devices 19 around a perimeter of the device 10D. In the present embodiment, the conductive devices 19 are wires 19A. However, other conductive devices 19 may be used without departing from the spirit and scope of the present invention. The wires 19A may have at least one end attached to a metal trace 16. Alternatively, both ends of the wire 19A may be attached to a metal trace 16. The metal trace 16 will generally be grounded. A section of the wire 19A will be exposed through the mold compound 24. The exposed portion of the wire 19A may contact the conductive coating 26. Thus, the semiconductor device 10D will have a conductive material 26 that contacts grounded metal to provide a perimeter RF shield.

Figure 9D:
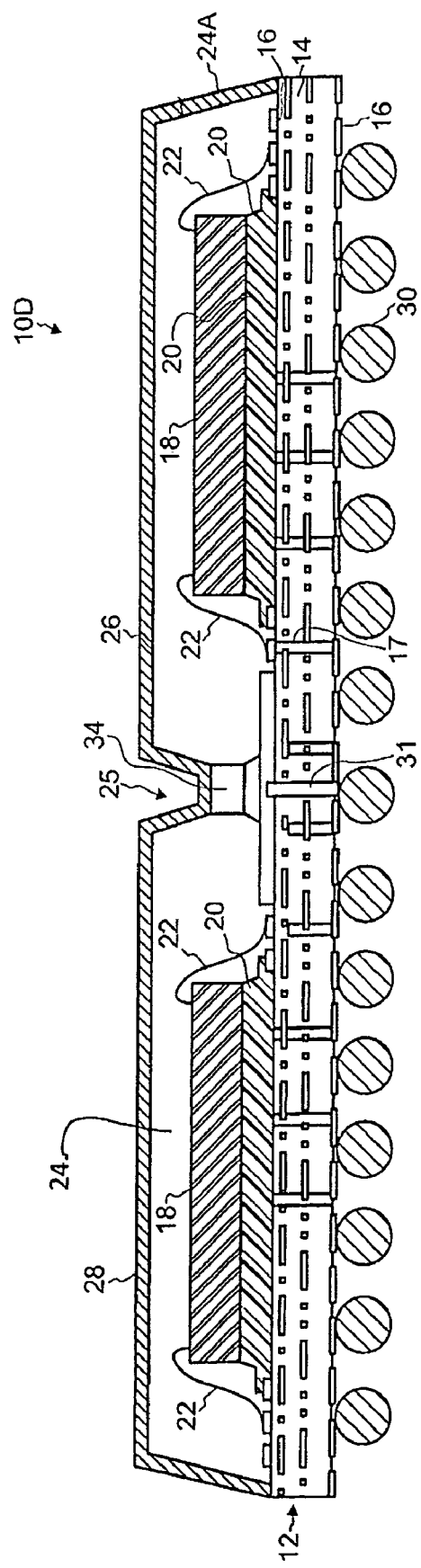
FIG. 9D is a cross-sectional side view of the embodiment of FIG. 9A showing one type of perimeter shield for the semiconductor device of the present invention.

Alternatively, as shown in FIG. 9D, the device 10D provides perimeter shielding by removing portions of the mold compound 24 to form side surfaces 24A. The mold compound 24 may be removed by a saw cut, laser ablation, or the like. The listing of the above is given as an example and should not be seen in a limiting scope. The conductive coating 26 may be applied to the top and side surfaces 21 of the mold compound 24 to form a perimeter RF shield.

Figure 9E:
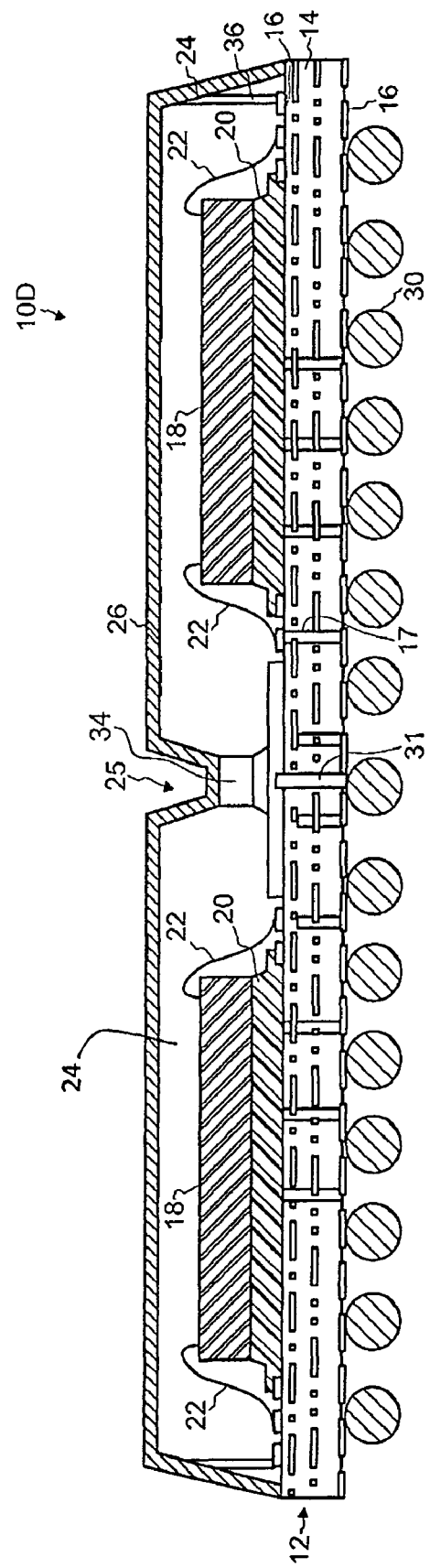
FIG. 9E is a cross-sectional side view of the embodiment of FIG. 9A showing one type of perimeter shield for the semiconductor device of the present invention.

Alternatively, as shown in FIG. 9E, ground wires 36 may be attached to metal traces 16. In the embodiment shown in FIG. 9E, the ground wires 36 are attached to metal traces 16 which are grounded. The ground wires 36 may be positioned around a perimeter of the device 10D. In the embodiment shown in FIG. 9E, the ground wires 36 may have a height which is less than a height of the electronic component 18. After the mold compound 24 encapsulates the device 10D, portions of the mold compound 24 may be removed so that a section of the ground wires 36 are exposed. In accordance with one embodiment, the mold compound 24 is removed to form angled side surfaces 24A on the mold compound 24. The top sections of the ground wires 36 are exposed on the angled surfaces 24A. It should be noted that the side surface 24A may or may not be angled and is given as an example and should not be seen as to limit the spirit and scope of the present invention. The conductive coating 26 may then be applied to the device 10D. The conductive coating 26 may be applied to the top surface of the mold compound 24 and to the sections of the ground wires 36 which are exposed. Thus, the semiconductor device 10D will have a conductive material 28 that contacts grounded metal.

FIGS. 9B-9E show different alternatives for providing perimeter shielding for the device 10D. The above is given as examples. Other methods of providing perimeter shielding for the device 10D may be sued without departing from the spirit and scope of the present invention.

Referring to FIGS. 10A-10C, a method of forming the device 10D of FIG. 9A is shown. The device 10D may have a substrate 12. The substrate 12 may include an insulation layer 14 having predetermined area and thickness. The insulation layer 14 may have an approximately planar first surface and an approximately planar second surface opposing the first surface. The substrate 12 may have a plurality of metal traces 16 formed on the first surface of the insulation layer 14. A plurality of metal traces 16 may also be formed on the second surface of the insulation layer 14. If multiple layers of metal traces 16 are formed, a dielectric layer may be applied between the metal traces 16. The dielectric layer may be used as an insulating layer to separate two signal layers. The number of multiple layers of metal traces 16 and insulation layers 14 is not limited to the number shown in FIGS. 10A-10C. A soldermask may be placed over the top surface of the metal traces 16 formed on the substrate 12. The soldermask may be used to protect the metal traces 16. One or more vias 17 may be formed through the insulation layer 14. The vias 17 may be used as an interconnect to connect different layers of metal traces 16.

One or more electronic component 18 may be attached to a first surface of the first substrate 12. In the embodiment shown in FIG. 10A, two electronic components 18 are attached to a first surface of the first substrate 12. The electronic components 18 may be coupled to the first surface of the first substrate 12 in a plurality of different manners. In the embodiment shown in FIG. 10A, an adhesive 20 may be used to couple the electronic components 18 to the first substrate 12. The electronic components 18 may then be electrically coupled to the first substrate 12 through the use of wirebonds 22. Alternatively, the electronic components 18 may be coupled to the substrate 12 through flip chip bonding, surface mount technology (SMT) or the like. The listing of the above coupling types should not be seen as to limit the scope of the present invention.

A ground pad 34 is attached to a metal trace 16. In the embodiment shown in FIG. 10A, the ground pad 34 is attached and positioned between the electronic components 18. The ground pad 34 may be a conductive material or component. The listing of the ground pad types should not be seen as to limit the scope of the present invention. A ground via 31 may be connected to the metal traces 16 and the ground pad 34

A mold compound 24 may be used to encapsulate the device 10D. The mold compound 24 may be used to encapsulate the components of the device 10D (i.e., electronic components 18), the wirebonds 22, and exposed areas on the first surface of the substrate 12.

Electrical contacts 30 may be coupled to a second surface of the substrate 16. The electrical contacts 30 may be a plurality of solder balls as shown in FIG. 10A, a plurality of leads, or the like. If solder balls are used, the solder balls may be electrically coupled to the second surface of the substrate 12. In general, a reflow process may be used to couple the solder balls to the second surface of the substrate 12. Alternative methods may be used to couple the leads to the substrate 16 without departing from the spirit and scope of the present invention.

Referring to FIG. 10B, portions 25 of the mold compound 24 may be removed between the electronic components 18. The mold compound 24 may be removed between the electronic components 18 to compartmentalized and provide EMI and RF shielding between the electronic components 18. In the embodiment shown in FIG. 10B, the mold compound 24 is removed between the electronic components 18 so that a top section of the ground pad 34 is exposed. In general, the mold compound 24 may be removed using a mechanical saw process. However, other methods may be used to remove the mold compound 24 between the electronic components 18 to expose the top section of the ground pad 34 without departing from the spirit and scope of the present invention.

Referring to FIG. 10C, a conductive coating 26 may then be applied to the device 10D. The conductive coating 26 may be used to provide EMI shielding for the device 10C. The conductive coating 26 may be applied to the top surface of the mold compound 24 and to the top section of the ground pad 34 which is exposed. By removing portions of the mold compound 24 between the electronic components 18 and then applying the conductive coating 26, a compartmentalized grounded EMI shield is formed between the electronic components 18.

In accordance with one embodiment, the conductive coating 26 may also be applied to side surfaces of the mold compound 24 and to side surfaces of the substrate 12. The conductive coating 26 may be attached to metal traces 16 which are exposed on side surfaces of the substrate 12. The conductive material 26 is applied so that the conductive material 26 will be in contact with the exposed metal traces 16. The above listing is given as an example regarding how the conductive coating 26 may be attached to metal traces 16 at or near the side surface of the substrate 12 and should not be seen as to limit the scope of the present invention.

A non-conductive coating (not shown) may be applied to the conductive coating 26. The non-conductive coating may be used as a protective layer to protect the conductive coating 26 and hence the device 10D from solvents, solders, fluxes, etc.

Figure 11:
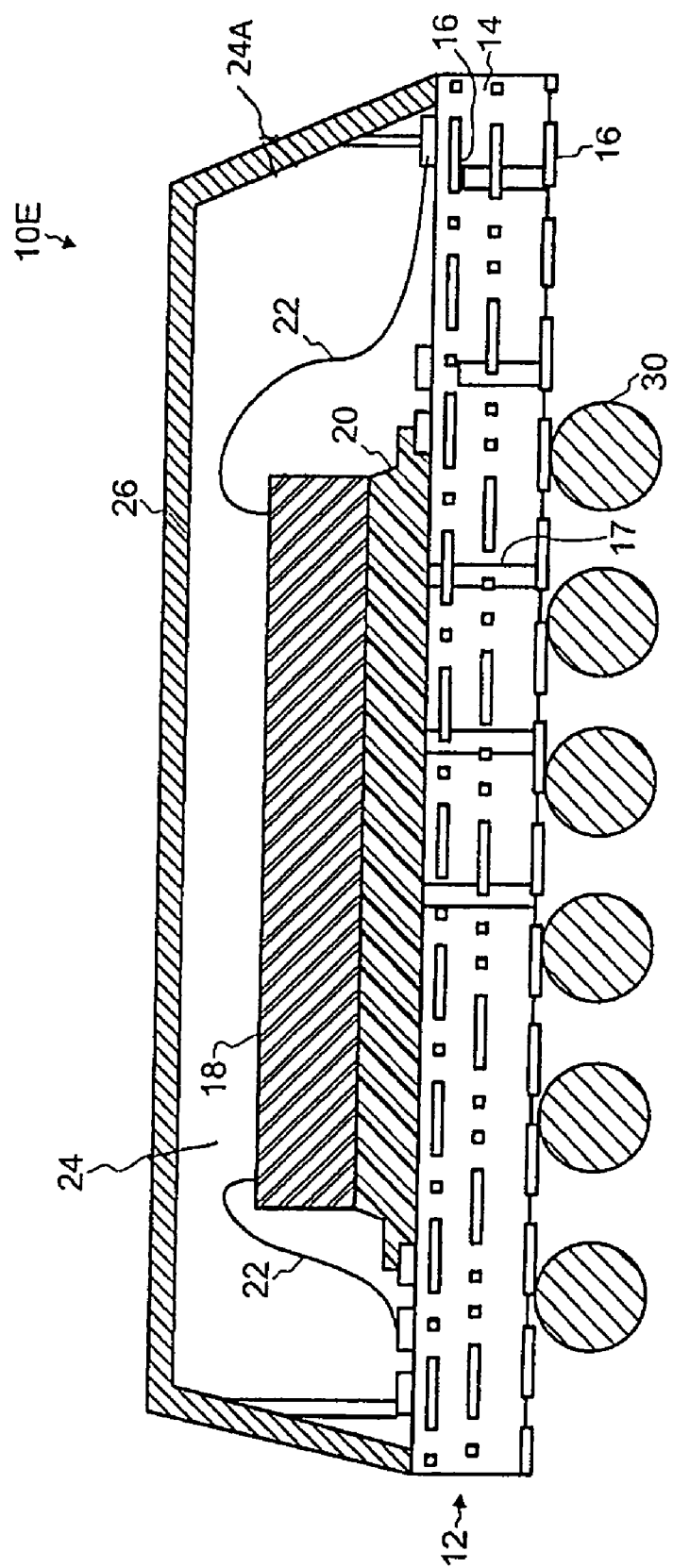
FIG. 11 is a cross-sectional side view of another embodiment of the semiconductor device of the present invention.

Referring to FIG. 11, another embodiment of the device 10E is shown. The device 10E has a substrate 12. The substrate 12 may include an insulation layer 14 having predetermined area and thickness. The insulation layer 14 may have an approximately planar first surface and an approximately planar second surface opposing the first surface. The substrate 12 may have a plurality of metal traces 16 formed on the first surface of the insulation layer 14. A plurality of metal traces 16 may also be formed on the second surface of the insulation layer 14. If multiple layers of metal traces 16 are formed, a dielectric layer may be applied between the metal traces 16. The dielectric layer may be used as an insulating layer to separate two signal layers. The number of multiple layers of metal traces 16 and insulation layers 14 is not limited to the number shown in FIG. 11. A soldermask may be placed over the top surface of the metal traces 16 formed on the substrate 12. The soldermask may be used to protect the metal traces 16. One or more vias 17 may be formed through the insulation layer 14. The vias 17 may be used as an interconnect to connect different layers of metal traces 16.

One or more electronic component 18 may be attached to a first surface of the first substrate 12. In the embodiment shown in FIG. 11, one electronic component 18 is attached to a first surface of the first substrate 12. The electronic component 18 may be coupled to the first surface of the first substrate 12 in a plurality of different manners. In the embodiment shown in FIG. 11, an adhesive 20 may be used to couple the electronic component 18 to the first substrate 12. The electronic component 18 may then be electrically coupled to the first substrate 12 through the use of wirebonds 22. Alternatively, the electronic component 18 may be coupled to the substrate 12 through flip chip bonding, surface mount technology (SMT) or the like. The listing of the above coupling types should not be seen as to limit the scope of the present invention.

Ground wires 36 may be attached to metal traces 16. In the embodiment shown in FIG. 11, the ground wires 36 are attached to metal traces 16 which are grounded. The ground wires 36 may be positioned formed around a perimeter of the electronic component 18. In the embodiment shown in FIG. 11, the ground wires 36 may have a height which is less than a height of the electronic device 18.

A mold compound 24 may be used to encapsulate the device 10E. The mold compound 24 may be used to encapsulate the components of the device 10E (i.e., electronic components 18), the wirebonds 22, exposed areas on the first surface of the substrate 12, and the ground wires 36.

Portions of the mold compound 24 may be removed so that a top section of the ground wires 36 are exposed. In general, the mold compound 24 may be removed using a mechanical saw process. However, other methods may be used to remove the mold compound 24 to expose the top section of the ground pin 32 without departing from the spirit and scope of the present invention. In accordance with one embodiment, the mold compound 24 is removed to form angled surfaces 24A on the mold compound 24. The top sections of the ground wires 36 are exposed on the angled surfaces 24A. It should be noted that the side surface 24A may or may not be angled and is given as an example and should not be seen as to limit the spirit and scope of the present invention.

A conductive coating 26 may then be applied to the device 10E. The conductive coating 26 may be used to provide EMI shielding for the device 10E. The conductive coating 26 may be applied to the top surface of the mold compound 24 and to the top section of the ground wires 36 which are exposed. Thus, the semiconductor device 10E will have a conductive material 28 that contacts grounded metal.

In accordance with one embodiment, the conductive coating 26 may also be applied to side surfaces of the mold compound 24 and to side surfaces of the substrate 12. The conductive coating 26 may be attached to metal traces 16 which are exposed on side surfaces of the substrate 12. The conductive material 26 is applied so that the conductive material 26 will be in contact with the exposed metal traces 16. The above listing is given as an example regarding how the conductive coating 26 may be attached to metal traces 16 at or near the side surface of the substrate 12 and should not be seen as to limit the scope of the present invention.

A non-conductive coating (not shown) may be applied to the conductive coating 26. The non-conductive coating 28 may be used as a protective layer to protect the conductive coating 26 and hence the device 10E from solvents, solders, fluxes, etc.

Electrical contacts 30 may be coupled to a second surface of the substrate 16. The electrical contacts 30 may be a plurality of solder balls as shown in FIG. 9, a plurality of leads, or the like. If solder balls are used, the solder balls may be electrically coupled to the second surface of the substrate 12. In general, a reflow process may be used to couple the solder balls to the second surface of the substrate 12. Alternative methods may be used to couple the leads to the substrate 16 without departing from the spirit and scope of the present invention.

Referring to FIGS. 12A-12C, a method of forming the device 10E is shown. The device 10E may be assembled in strip fashion. Thus, a plurality of devices 10E may be formed from a single substrate strip. As shown in FIG. 12A, the device 10E may have a substrate 12. The substrate 12 may include an insulation layer 14 having predetermined area and thickness. The insulation layer 14 may have an approximately planar first surface and an approximately planar second surface opposing the first surface. The substrate 12 may have a plurality of metal traces 16 formed on the first surface of the insulation layer 14. A plurality of metal traces 16 may also be formed on the second surface of the insulation layer 14. If multiple layers of metal traces 16 are formed, a dielectric layer may be applied between the metal traces 16. The number of multiple layers of metal traces 16 and insulation layers 14 is not limited to the number shown in FIGS. 12A-12C. The dielectric layer may be used as an insulating layer to separate two signal layers. A soldermask may be placed over the top surface of the metal traces 16 formed on the substrate 12. The soldermask may be used to protect the metal traces 16. One or more vias 17 may be formed through the insulation layer 14. The vias 17 may be used as an interconnect to connect different layers of metal traces 16.

One or more electronic component 18 may be attached to a first surface of the first substrate 12. In the embodiment shown in FIG. 12A, one electronic component 18 is attached to a first surface of the first substrate 12. The electronic component 18 may be coupled to the first surface of the first substrate 12 in a plurality of different manners. In the embodiment shown in FIG. 11A, an adhesive 20 may be used to couple the electronic components 18 to the first substrate 12. The electronic components 18 may then be electrically coupled to the first substrate 12 through the use of wirebonds 22. Alternatively, the electronic components 18 may be coupled to the substrate 12 through flip chip bonding, surface mount technology (SMT) or the like. The listing of the above coupling types should not be seen as to limit the scope of the present invention.

Ground wires 36 are attached to metal traces 16. In the embodiment shown in FIG. 12A, the metal traces 16 are grounded. The ground wires 36 may be positioned around a perimeter of the electronic components 18. The ground wires 36 may be wires, pins, or the like. The listing of the above is given as an example. In general, the ground wires 36 may have a larger diameter than the wirebonds 22.

A mold compound 24 may be used to encapsulate the device 10E. The mold compound 24 may be used to encapsulate the components of the device 10E (i.e., electronic components 18), the wirebonds 22, and exposed areas on the first surface of the substrate 12.

Electrical contacts 30 may be coupled to a second surface of the substrate 16. The electrical contacts 30 may be a plurality of solder balls as shown in FIG. 12A, a plurality of leads, or the like. If solder balls are used, the solder balls may be electrically coupled to the second surface of the substrate 12. In general, a reflow process may be used to couple the solder balls to the second surface of the substrate 12. Alternative methods may be used to couple the leads to the substrate 16 without departing from the spirit and scope of the present invention.

Referring to FIG. 12B, sections of the mold compound 24 may be removed so that top sections of the ground wires 36 are exposed. In general, the mold compound 24 may be removed using a mechanical saw process. However, other methods may be used to remove the mold compound 24 between the electronic components 18 to expose the top section of the ground wires 36 without departing from the spirit and scope of the present invention. In accordance with one embodiment, the mold compound 24 is removed to form angled surfaces 24A on the mold compound 24. The top sections of the ground wires 36 are exposed on the angled surfaces 24A. It should be noted that the side surface 24A may or may not be angled and is given as an example and should not be seen as to limit the spirit and scope of the present invention.

Referring to FIG. 12C, a conductive coating 26 may then be applied to the device 10C. The conductive coating 26 may be used to provide EMI shielding for the device 10C. The conductive coating 26 may be applied to the top surface of the mold compound 24 and the angled surfaces 24A and attached to top sections of the ground wires 36 which are exposed. It should be noted that the side surface 24A may or may not be angled and is given as an example and should not be seen as to limit the spirit and scope of the present invention. Referring to FIG. 12D, a second portion 25C of the mold compound 24 and substrate 12 are removed by a mechanical means between electronic components 18. The device 10E may be assembled in strip fashion. Thus, a plurality of devices 10E may be formed from a single substrate strip.

In accordance with one embodiment, the conductive coating 26 may also be applied to side surfaces of the mold compound 24 and to side surfaces of the substrate 12. The conductive coating 26 may be attached to metal traces 16 which are exposed on side surfaces of the substrate 12. The conductive material 26 is applied so that the conductive material 26 will be in contact with the exposed metal traces 16. The above listing is given as an example regarding how the conductive coating 26 may be attached to metal traces 16 at or near the side surface of the substrate 12 and should not be seen as to limit the scope of the present invention.

A non-conductive coating (not shown) may be applied to the conductive coating 26. The non-conductive coating may be used as a protective layer to protect the conductive coating 26 and hence the device 12C from solvents, solders, fluxes, etc.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor device comprising:
   a substrate having a plurality of metal traces;
   a plurality of electronic components electrically coupled to a first surface of the substrate;
   a mold compound for encapsulating portions of the electronic components and the first surface of the substrate, wherein a portion of the mold compound is removed between the electronic components and forms at least one channel between the plurality of electronic components; and
   a conductive coating applied to an exterior top surface of the mold compound and an area where the portion of the mold compound is removed, wherein the conductive coating is applied to at least one side surface of the substrate and attached to a ground plane exposed on the side surface.

2. A semiconductor device in accordance with claim 1 wherein the portion of the mold compound removed between the electronic components exposes a grounding device on the first surface of the substrate, the conductive coating attached to the grounding device.

3. A semiconductor device in accordance with claim 2, wherein the grounding device is a ground plane formed on the first surface of the substrate.

4. A semiconductor device in accordance with claim 2, wherein the grounding device is a ground connection attached to the first surface of the substrate.

5. A semiconductor device in accordance with claim 2, wherein the grounding connection is a ground pad attached to the first surface of the substrate.

6. A semiconductor device in accordance with claim 1 wherein the conductive coating is a conformal coating.

7. A semiconductor device in accordance with claim 1, further comprising contacts attached to a second surface of the substrate.

8. A semiconductor device comprising:
a substrate having a plurality of metal traces;
a plurality of electronic components electrically attached to a first surface of the substrate;
ground wires attached to the first surface of the substrate and around a perimeter of the device;
a mold compound for encapsulating portions of the semiconductor device and the first surface of the substrate, wherein a portion of the mold compound is removed between the electronic components and forms at least one channel between the plurality of electronic components, top surfaces of the ground wires are exposed through the mold compound; and
a conductive coating applied to an exterior top surface of the mold compound and an area where the portion of the mold compound is removed, the conductive coating in contact with the exposed top surfaces of the ground wires.

9. A semiconductor device in accordance with claim 8, wherein a portion of the mold compound is removed to expose portions of the ground wires.

10. A semiconductor device in accordance with claim 8, further comprising contacts coupled to a second surface of the substrate.

11. A semiconductor device in accordance with claim 8, wherein the conductive coating is a conformal coating.

12. A semiconductor device comprising:
a substrate having a plurality of metal traces;
a plurality of electronic components electrically coupled to a first surface of the substrate;
a mold compound for encapsulating portions of the electronic component and the first surface of the substrate, wherein a portion of the mold compound is removed around at least one side of the electronic component; and
means for providing RF shielding applied to a top surface of the mold compound and an area where the portion of the mold compound is removed, wherein the means for providing RF shielding is applied to at least one side surface of the substrate and attached to a ground plane exposed on the side surface.

13. A semiconductor device in accordance with claim 12, further comprising:
a plurality of electronic components;
wherein the portion of the mold compound removed is between the electronic components and forms at least one channel between the plurality of electronic components, the means for providing RF shielding attached to the channel.

14. A semiconductor device in accordance with claim 12, further comprising means for protecting applied to the means for providing RF shielding.

15. A semiconductor device in accordance with claim 13, wherein the portion of the mold compound removed between the electronic components exposes a means for grounding formed on the first surface of the substrate, the means for providing RF shielding attached to the means for grounding.

16. A semiconductor device in accordance with claim 12, wherein the means for providing RF shielding is applied to at least one side surface of the substrate and attached to a ground plane exposed on the side surface.

17. A semiconductor device in accordance with claim 12, further comprising:
ground wires attached to the first surface of the substrate and around the at least one electronic component;
wherein the means for providing RF shielding contacts with exposed top surfaces of the ground wires.

18. A semiconductor device in accordance with claim 12, further comprising contacts attached to a second surface of the substrate.

* * * * *